US012652925B2

(12) United States Patent　　(10) Patent No.: US 12,652,925 B2
Hu　　(45) Date of Patent: Jun. 9, 2026

(54) DISPLAY SUBSTRATE AND DISPLAY DEVICE

(71) Applicants: Chengdu BOE Optoelectronics Technology Co., Ltd., Chengdu (CN); BOE TECHNOLOGY GROUP CO., LTD., Beijing (CN)

(72) Inventor: Yao Hu, Beijing (CN)

(73) Assignees: Chengdu BOE Optoelectronics Technology Co., Ltd., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 427 days.

(21) Appl. No.: 18/286,268

(22) PCT Filed: Jul. 27, 2022

(86) PCT No.: PCT/CN2022/108280
§ 371 (c)(1),
(2) Date: Oct. 10, 2023

(87) PCT Pub. No.: WO2024/020864
PCT Pub. Date: Feb. 1, 2024

(65) Prior Publication Data
US 2025/0089511 A1　　Mar. 13, 2025

(51) Int. Cl.
*H10K 59/38* (2023.01)
*H10K 59/122* (2023.01)
(Continued)

(52) U.S. Cl.
CPC ........... *H10K 59/38* (2023.02); *H10K 59/122* (2023.02); *H10K 59/131* (2023.02); *H10K 59/879* (2023.02)

(58) Field of Classification Search
CPC .... H10K 59/38; H10K 59/122; H10K 59/131; H10K 59/879; H10K 59/1213; (Continued)

(56) References Cited

U.S. PATENT DOCUMENTS 10,209,568 B2　2/2019　Zhou
10,679,559 B2　6/2020　Ding et al.
(Continued)

FOREIGN PATENT DOCUMENTS

CN　　102280074 A　　12/2011
CN　　104037201 A　　9/2014
(Continued)

OTHER PUBLICATIONS

International Search Report in PCT/CN2022/108280 in Chinese dated Nov. 29, 2022 with English translation.
(Continued)

*Primary Examiner* — Khiem D Nguyen
(74) *Attorney, Agent, or Firm* — Collard & Roe, P.C.

(57)　　ABSTRACT
Disclosed are a display substrate and a display device. In the display substrate, a distance between one light-emitting element of the plurality of light-emitting elements and a corresponding color filter of the plurality of color filters in a direction perpendicular to the driving substrate is a vertical distance a, a distance between the light-emitting element and an edge of the first light-transmitting opening adjacent to the corresponding color filter in a direction parallel to the driving substrate is a lateral distance b, and the vertical distance a and the lateral distance b satisfy a formula as follows:

$$0.866 \times \frac{n2}{n1} \ll \frac{a}{\sqrt{a^2+b^2}},$$

(Continued)

100 where n1 is a refractive index of the cover plate and n2 is a refractive index of air.

20 Claims, 18 Drawing Sheets

(51) Int. Cl.
  *H10K 59/131*          (2023.01)
  *H10K 59/80*            (2023.01)
(58) Field of Classification Search
  CPC ............. H10K 59/1216; H10K 59/352; H10K
                59/353; H10K 59/873; H10K 59/8792;
                                      H10K 59/80515
  See application file for complete search history.

(56)              References Cited

U.S. PATENT DOCUMENTS

| | | | |
|---|---|---|---|
| 10,853,618 | B2 | 12/2020 | Ko et al. |
| 10,943,955 | B2 | 3/2021 | Wang et al. |
| 10,978,516 | B2 | 4/2021 | Shao et al. |
| 11,088,219 | B2 | 8/2021 | Ryu et al. |
| 11,271,183 | B2 | 3/2022 | Zeng et al. |
| 11,302,752 | B2 | 4/2022 | Huang |
| 11,616,109 | B2 * | 3/2023 | Ma ......................... H10K 59/65 345/82 |
| 11,930,681 | B2 | 3/2024 | Wang et al. |
| 2011/0285680 | A1 | 11/2011 | Nakamura |
| 2015/0362165 | A1 | 12/2015 | Chu et al. |
| 2019/0079607 | A1 * | 3/2019 | Tai .................... G02F 1/133512 |
| 2020/0105841 | A1 | 4/2020 | Bang et al. |
| 2021/0109617 | A1 * | 4/2021 | Lin ......................... H10K 59/38 |
| 2021/0334504 | A1 * | 10/2021 | Lu ....................... H10F 39/8053 |
| 2021/0335910 | A1 | 10/2021 | Tan et al. |
| 2021/0376003 | A1 * | 12/2021 | Xu ......................... G06F 3/0412 |
| 2022/0011482 | A1 | 1/2022 | Wang et al. |
| 2022/0067340 | A1 * | 3/2022 | Han ..................... H10K 59/122 |
| 2022/0392971 | A1 | 12/2022 | Wang et al. |
| 2023/0015554 | A1 | 1/2023 | Zhu et al. |

FOREIGN PATENT DOCUMENTS

| | | |
|---|---|---|
| CN | 106598327 A | 4/2017 |
| CN | 206076238 U | 4/2017 |
| CN | 107065360 A | 8/2017 |
| CN | 109728044 A | 5/2019 |
| CN | 110061042 A | 7/2019 |
| CN | 110349528 A | 10/2019 |
| CN | 110518052 A | 11/2019 |
| CN | 111162110 A | 5/2020 |
| CN | 111415960 A | 7/2020 |
| CN | 111564571 A | 8/2020 |
| CN | 111694189 A | 9/2020 |
| CN | 111725264 A | 9/2020 |
| CN | 111799320 A | 10/2020 |
| CN | 112103328 A | 12/2020 |
| CN | 112186022 A | 1/2021 |
| CN | 112259584 A | 1/2021 |
| CN | 112313802 A | 2/2021 |
| KR | 10-2019-0037391 A | 4/2019 |

OTHER PUBLICATIONS

Written Opinion of the international Search Authority in PCT/ CN2022/108280 in Chinese dated Nov. 29, 2022.

* cited by examiner

10

10

100

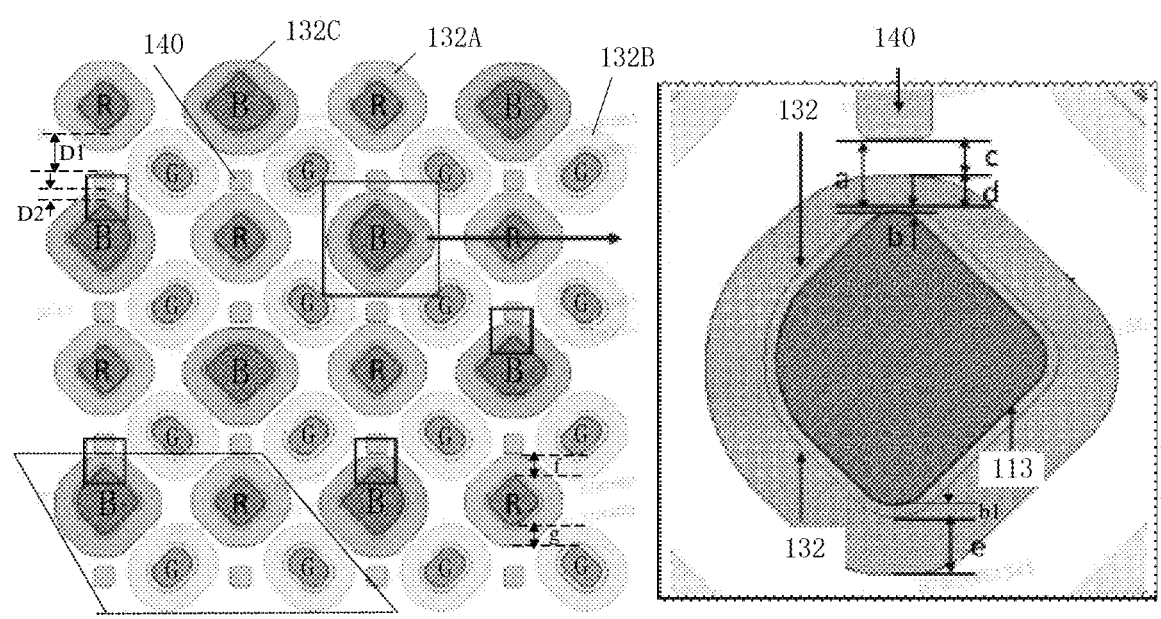
FIG. 9
FIG. 10
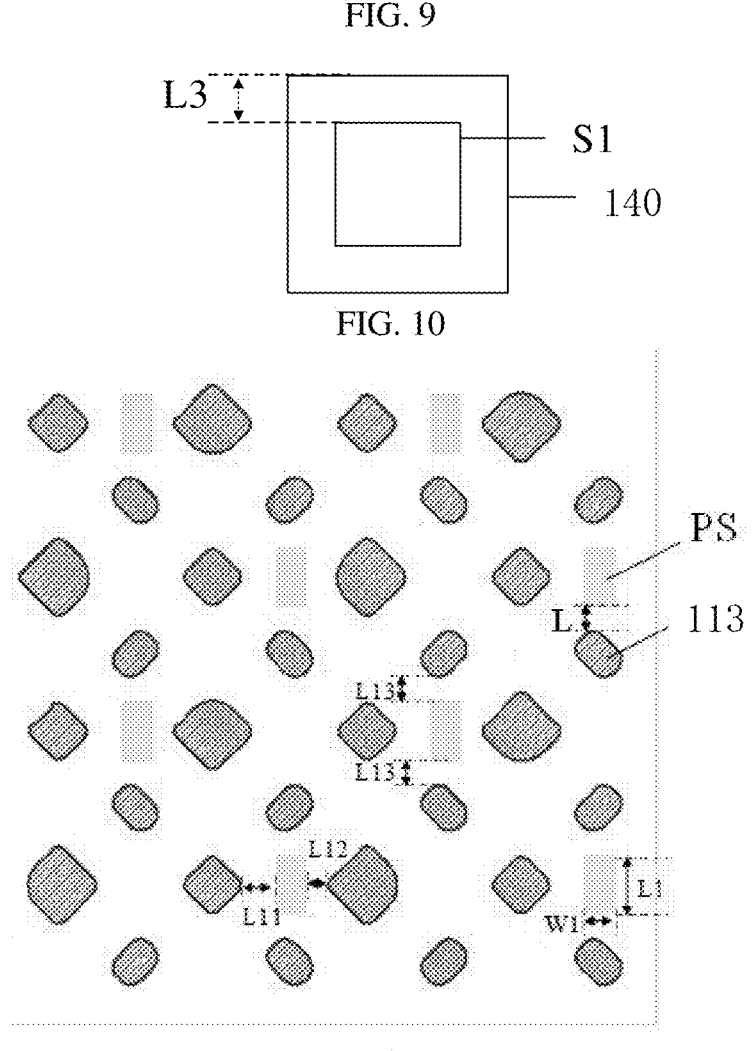
FIG. 11

Display Device 300

Display Substrate 100

DISPLAY SUBSTRATE AND DISPLAY DEVICE

CROSS REFERENCE TO RELATED APPLICATIONS

This application is the National Stage of PCT/CN2022/108280 filed on Jul. 27, 2022, the disclosure of which is incorporated by reference.

TECHNICAL FIELD

Embodiments of the present disclosure relate to a display substrate and a display device.

BACKGROUND

With the continuous development of display technology, people have higher and higher requirements for the display quality of display devices. Organic light-emitting diode (OLED) display devices have more and more extensive application range due to the advantages of wide color gamut, fast response, flexible display, bendability, and high contrast, etc.

On the other hand, consumers' pursuit of display color gamut and high standby time make the application of color filter on encapsulation (COE) in organic light-emitting diode display devices become a research hotspot.

SUMMARY

Embodiments of the present disclosure provides a display substrate and a display device. The display substrate includes: a driving substrate, a plurality of light-emitting elements, a color filter layer, a first light-transmitting opening, an optical adhesive layer, and a cover plate; the plurality of light-emitting elements are located on the driving substrate; the color filter layer is located at a side of the plurality of light-emitting elements away from the driving substrate, and includes a plurality of color filters and a black matrix between adjacent color filters; the first light-transmitting opening is located in the black matrix; the optical adhesive layer is located at a side of the color filter layer away from the driving substrate; and the cover plate is located at a side of the optical adhesive layer away from the color filter layer, the plurality of light-emitting elements are arranged in one-to-one correspondence with the plurality of color filters, a distance between one light-emitting element of the plurality of light-emitting elements and a corresponding color filter of the plurality of color filters in a direction perpendicular to the driving substrate is a vertical distance a, a distance between the light-emitting element and an edge of the first light-transmitting opening adjacent to the corresponding color filter in a direction parallel to the driving substrate is a lateral distance b. By controlling the vertical distance between the light-emitting element and the corresponding color filter in the direction perpendicular to the driving substrate and the distance between the edge of the first light-transmitting opening adjacent to the corresponding color filter in the direction parallel to the driving substrate to satisfy a certain relationship, the display substrate can limit the emergent angle of stray light, and make the stray light refract at the interface between the display substrate and the air, so that the emergent angle of stray light is larger, thereby avoiding the influence of stray light on normal display.

At least one embodiment of the present disclosure provides a display substrate, which includes: a driving substrate; a plurality of light-emitting elements, located on the driving substrate; a color filter layer, located at a side of the plurality of light-emitting elements away from the driving substrate, and including a plurality of color filters and a black matrix between adjacent color filters; a first light-transmitting opening, located in the black matrix; an optical adhesive layer, located at a side of the color filter layer away from the driving substrate; and a cover plate, located at a side of the optical adhesive layer away from the color filter layer, the plurality of light-emitting elements are arranged in one-to-one correspondence with the plurality of color filters, a distance between one light-emitting element of the plurality of light-emitting elements and a corresponding color filter of the plurality of color filters in a direction perpendicular to the driving substrate is a vertical distance a, a distance between the light-emitting element and an edge of the first light-transmitting opening adjacent to the corresponding color filter in a direction parallel to the driving substrate is a lateral distance b, and the vertical distance a and the lateral distance b satisfy a formula as follows:

$$0.866 \times \frac{n2}{n1} \ll \frac{a}{\sqrt{a^2 + b^2}},$$

where n1 is a refractive index of the cover plate and n2 is a refractive index of air.

For example, in the display substrate provided by an embodiment of the present disclosure, the vertical distance a and the lateral distance b satisfy a formula as follows:

$$\frac{n2}{n1} \ll \frac{a}{\sqrt{a^2 + b^2}}.$$

For example, in the display substrate provided by an embodiment of the present disclosure, the vertical distance a and the lateral distance b satisfy a formula as follows:

$$\frac{2}{3} \ll \frac{a}{\sqrt{a^2 + b^2}}.$$

For example, in the display substrate provided by an embodiment of the present disclosure, the refractive index of the cover plate is less than or equal to 1.55.

For example, in the display substrate provided by an embodiment of the present disclosure, the plurality of light-emitting elements include a first light-emitting element, a second light-emitting element, and a third light-emitting element, and the plurality of color filters include a first filter, a second filter, and a third filter, the first filter is configured to allow light of a first color to pass through, the second filter is configured to allow light of a second color to pass through, the third filter is configured to allow light of a third color to pass through, the first light-emitting element is arranged corresponding to the first filter, the second light-emitting element is arranged corresponding to the second filter, and the third light-emitting element is arranged corresponding to the third filter.

For example, in the display substrate provided by an embodiment of the present disclosure, a distance between one first light-emitting element and a corresponding first color filter in the direction perpendicular to the driving substrate is a first vertical distance a1, and a distance between the first light-emitting element and an edge of the first light-transmitting opening adjacent to the corresponding first color filter in the direction parallel to the driving substrate is a first lateral distance b1, a distance between one second light-emitting element and a corresponding second color filter in the direction perpendicular to the driving substrate is a second vertical distance a2, and a distance between the second light-emitting element and an edge of the first light-transmitting opening adjacent to the corresponding second color filter in the direction parallel to the driving substrate is a second lateral distance b2, a distance between one third light-emitting element and a corresponding third color filter in the direction perpendicular to the driving substrate is a third vertical distance a3, and a distance between the third light-emitting element and an edge of the first light-transmitting opening adjacent to the corresponding third color filter in the direction parallel to the driving substrate is a third lateral distance b3, the first lateral distance b1, the second lateral distance b2, and the third lateral distance b3 are different from each other.

For example, in the display substrate provided by an embodiment of the present disclosure, a1, b1, a2, b2, a3, and b3 satisfy a formula as follows:

$$\frac{a3}{\sqrt{a3^2 + b3^2}} \ll \frac{a2}{\sqrt{a2^2 + b2^2}} \ll \frac{a1}{\sqrt{a1^2 + b1^2}}.$$

For example, in the display substrate provided by an embodiment of the present disclosure, a size of the first light-transmitting opening between the first color filter and the second color filter is greater than a size of the first light-transmitting opening between the first color filter and the third color filter.

For example, in the display substrate provided by an embodiment of the present disclosure, a size of the first light-transmitting opening between the first color filter and the second color filter is greater than a size of the first light-transmitting opening between the second color filter and the third color filter.

For example, in the display substrate provided by an embodiment of the present disclosure, a1, b1, a2, b2, a3, and b3 satisfy a formula as follows:

$$\frac{a1}{\sqrt{a1^2 + b1^2}} : \frac{a2}{\sqrt{a2^2 + b2^2}} : \frac{a2}{\sqrt{a2^2 + b2^2}} = 10 : 8.5 : 7.$$

For example, in the display substrate provided by an embodiment of the present disclosure, the first light-emitting element is configured to emit light of the first color, the second light-emitting element is configured to emit light of the second color, and the third light-emitting element is configured to emit light of the third color.

For example, in the display substrate provided by an embodiment of the present disclosure, the first color is red, the second color is green, and the third color is blue.

For example, in the display substrate provided by an embodiment of the present disclosure, each of the plurality of light-emitting elements includes an anode, an organic light-emitting layer, and a cathode.

For example, the display substrate provided by an embodiment of the present disclosure further includes: an optical sensor, located at a side of the driving substrate away from the plurality of light-emitting elements.

For example, in the display substrate provided by an embodiment of the present disclosure, the optical sensor includes at least one selected from the group consisting of an optical fingerprint identification sensor, a face identification sensor, an infrared sensor, and a distance sensor.

For example, in the display substrate provided by an embodiment of the present disclosure, the display substrate includes a display region and a non-display region surrounding the display region, the display region includes a fingerprint identification region and a normal display region at an outer side of the fingerprint identification region, and the first light-transmitting opening is located in the fingerprint identification region.

For example, in the display substrate provided by an embodiment of the present disclosure, the driving substrate includes: a base substrate; a light-shielding layer, disposed on the base substrate, and including a plurality of second light-transmitting openings; a pixel driving circuit layer, disposed at a side of the light-shielding layer away from the base substrate; and a pixel defining layer, disposed at a side of the pixel driving circuit layer away from the base substrate and including a plurality of sub-pixel openings; the pixel driving circuit layer includes a plurality of pixel driving circuits, the plurality of pixel driving circuits are electrically connected with the plurality of light-emitting elements and configured to drive the plurality of light-emitting elements to emit light, the plurality of light-emitting elements are disposed in the plurality of sub-pixel openings and form a plurality of sub-pixels with the plurality of pixel driving circuits; orthographic projections of at least part of the plurality of second light-transmitting openings on the base substrate overlap with an orthographic projection of the first light-transmitting opening on the base substrate.

For example, in the display substrate provided by an embodiment of the present disclosure, orthographic projections of the plurality of second light-transmitting openings on the base substrate are located between orthographic projections of the plurality of sub-pixel openings on the base substrate, and the orthographic projections of the plurality of sub-pixel openings on the base substrate overlap with orthographic projections of the plurality of color filters on the base substrate, respectively.

For example, in the display substrate provided by an embodiment of the present disclosure, the orthographic projections of at least part of the plurality of second light-transmitting openings on the base substrate are located within the orthographic projection of the first light-transmitting opening on the base substrate.

For example, in the display substrate provided by an embodiment of the present disclosure, the pixel driving circuit layer further includes a first signal line and a second signal line which are arranged in parallel and periodically, and the first signal line and the second signal line are configured to provide different electrical signals to the plurality of pixel driving circuits, an orthographic projection of each of the plurality of second light-transmitting openings on the base substrate is located between orthographic projections of the first signal line and the second signal line that are adjacent to each other on the base substrate.

For example, in the display substrate provided by an embodiment of the present disclosure, the first signal line is a light-emitting control signal line, and the second signal line is a reset control line.

For example, in the display substrate provided by an embodiment of the present disclosure, the pixel driving circuit layer includes third signal lines which are arranged in parallel and periodically, each of the third signal lines is intersected with the first signal line and the second signal line, respectively, and the third signal line is configured to provide a power signal to the plurality of pixel driving circuits, the third signal line includes a hollowed-out portion, and an orthographic projection of each of the plurality of second light-transmitting openings on the base substrate is located within an orthographic projection of the hollowed-out portion on the base substrate.

For example, in the display substrate provided by an embodiment of the present disclosure, the orthographic projection of the first light-transmitting opening on the base substrate does not overlap with orthographic projections of the first signal line and the second signal line on the base substrate, the orthographic projection of the first light-transmitting opening on the base substrate is located within the orthographic projection of the hollowed-out portion on the base substrate.

For example, the display substrate provided by an embodiment of the present disclosure further includes a spacer layer disposed at a side of the pixel defining layer away from the base substrate, the spacer layer includes a plurality of spacers, and a light transmittance of a material of the spacer layer is less than 5%.

At least one embodiment of the present disclosure further provides a display device, including the above display substrate.

BRIEF DESCRIPTION OF DRAWINGS

Hereinafter, the drawings accompanying embodiments of the present disclosure are simply introduced in order to more clearly explain technical solution(s) of the embodiments of the present disclosure. Obviously, the described drawings below are merely related to some of the embodiments of the present disclosure without constituting any limitation thereto.

FIG. 9 is a schematic partial plan view illustrating stacked layers of a light-shielding layer, a color filter layer, and color filters in a display substrate provided by at least one embodiment of the present disclosure;

FIG. 10 is a schematic plan view illustrating stacked layers of a first light-transmitting opening and a second light-transmitting opening in a display substrate provided by at least one embodiment of the present disclosure;

6

Figure 12:
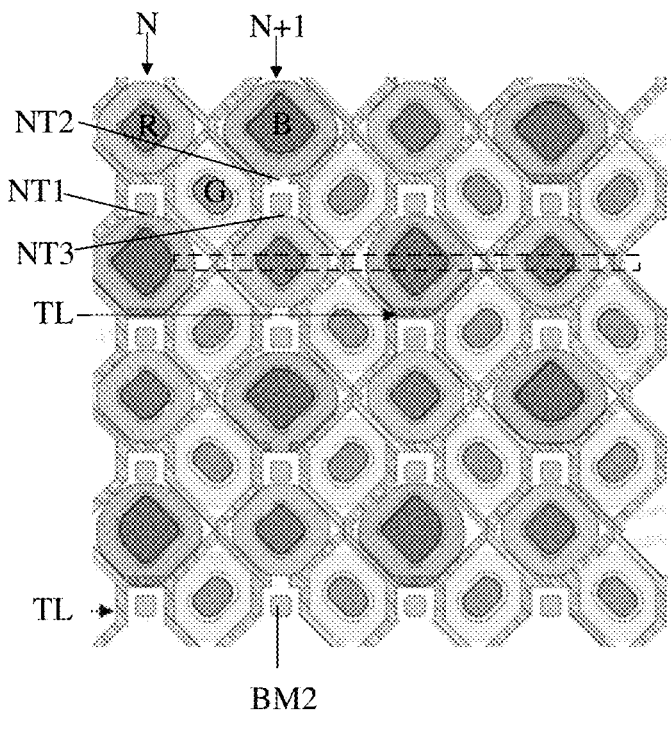
Figure 13:
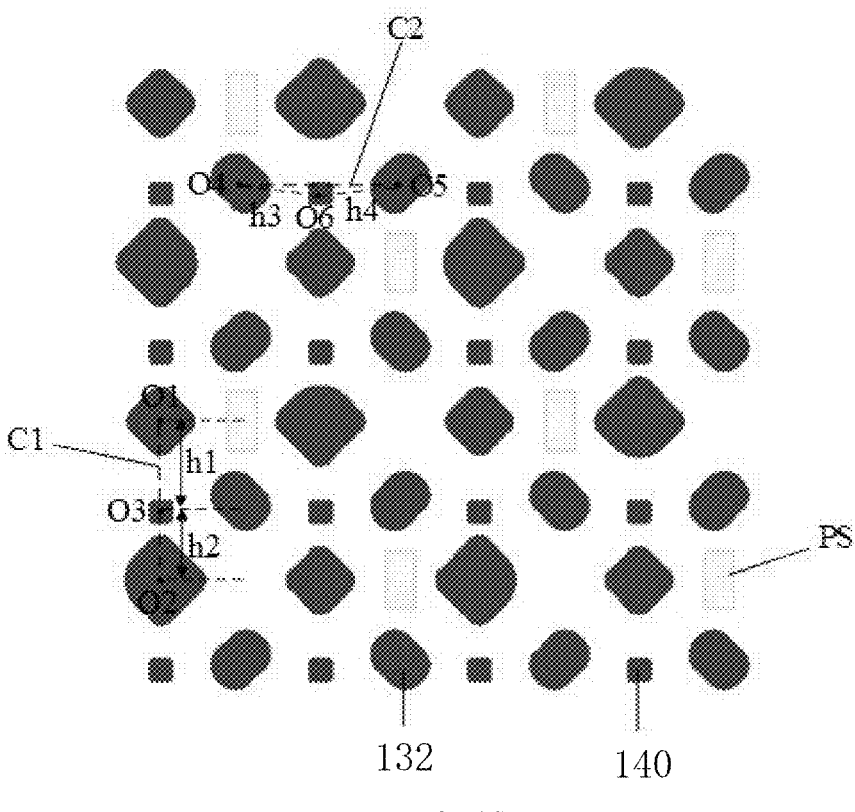
Figure 14:
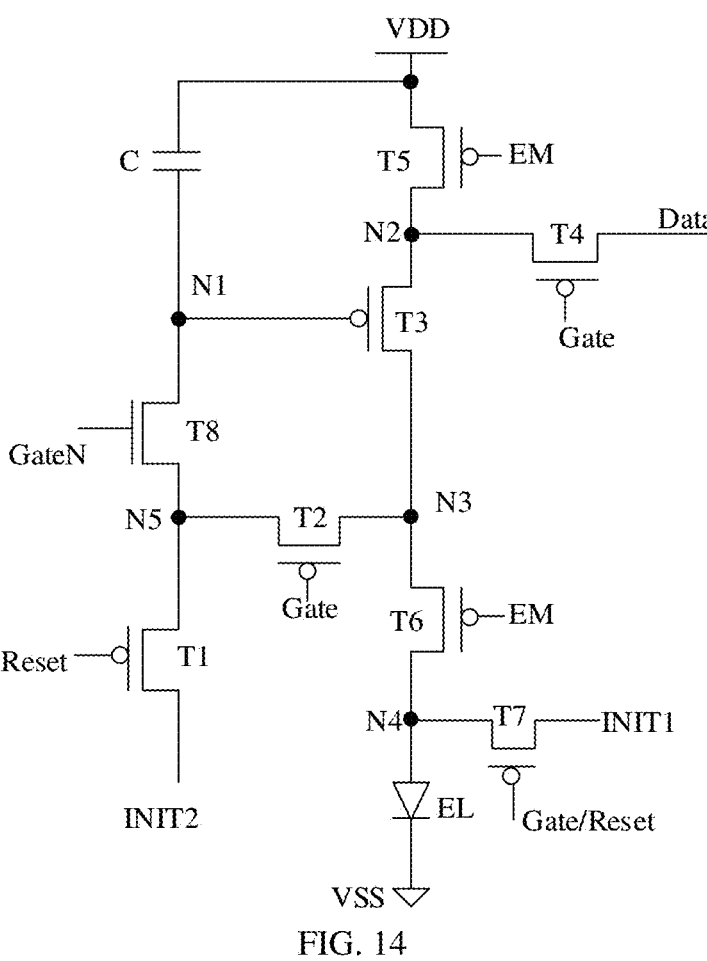
Figure 15:
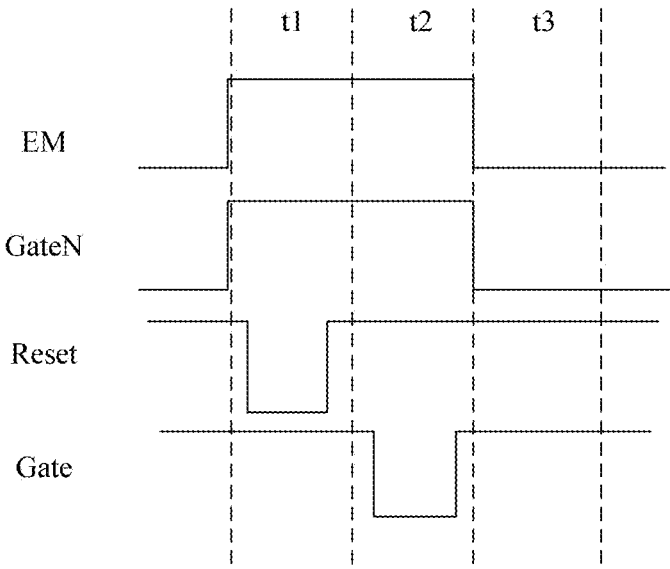
Figure 28:
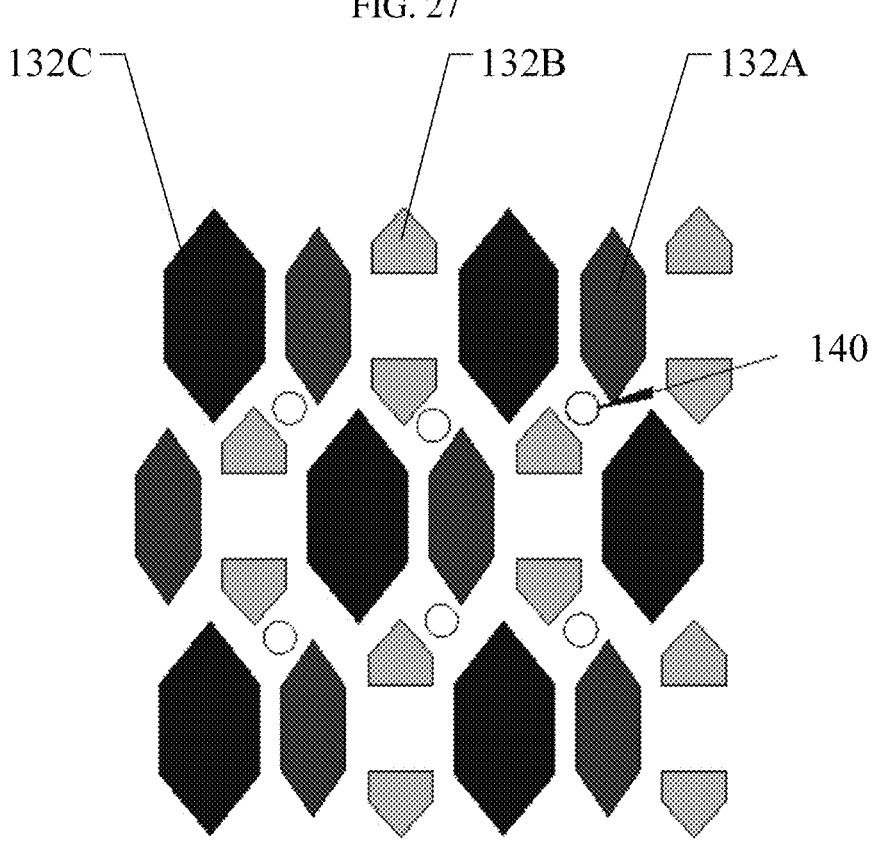
Figures 29, 30:
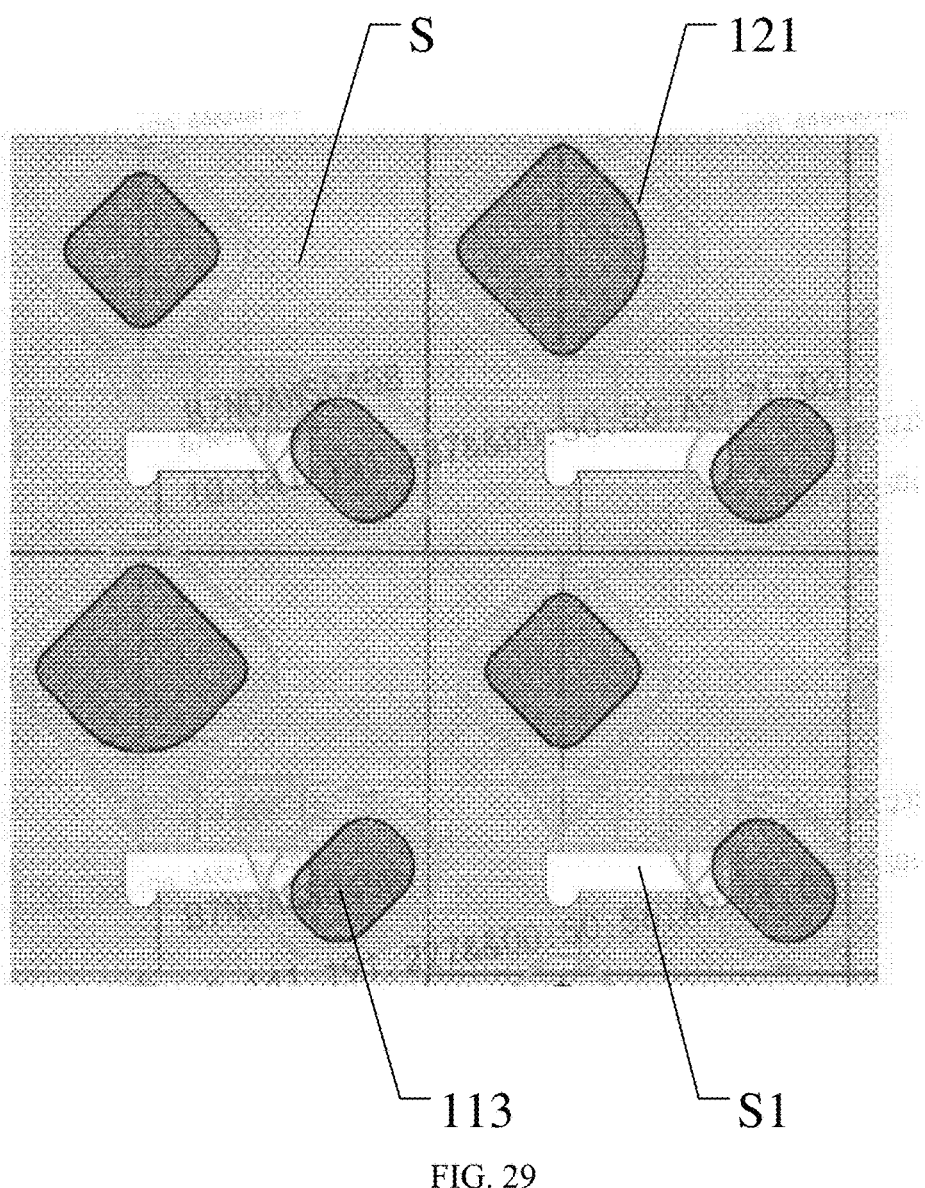

FIG. 11 is a schematic plan view of arrangement of a plurality of spacers in a spacer layer of a display substrate provided by at least one embodiment of the present disclosure;

FIG. 12 is a schematic plan view illustrating stacked layers of a color filter layer and a touch layer in a display substrate provided by at least one embodiment of the present disclosure;

FIG. 13 is a schematic plan view illustrating stacked layers of a spacer layer and a color filter layer in a display substrate provided by at least one embodiment of the present disclosure;

FIG. 14 is an equivalent circuit diagram of an 8T1C pixel driving circuit provided by at least one embodiment of the present disclosure;

FIG. 15 is an operation timing diagram of a pixel driving circuit provided by at least one embodiment of the present disclosure;

FIG. 16-FIG. 27 are schematic plan views of various layers in a display substrate provided by at least one embodiment of the present disclosure;

FIG. 28 is a schematic view illustrating stacked layers of a first light-transmitting opening and color filters provided by an embodiment of the present disclosure;

FIG. 29 is a schematic view illustrating stacked layers of a light-shielding layer, a first electrode, and a sub-pixel opening provided by an embodiment of the present disclosure; and FIG. 30 is a schematic diagram of a display device provided by an embodiment of the present disclosure.

DETAILED DESCRIPTION

In order to make objectives, technical details and advantages of the embodiments of the present disclosure more clear, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly.

In the organic light-emitting diode display device adopting color filter on encapsulation (COE) technology, COE technology replaces the polarizer by providing a color filter on the encapsulation layer. On the one hand, the color filter can be used to further improve the light purity of different color sub-pixels, thus improving the display color gamut; on the other hand, the polarizer can be omitted, thus reducing the light loss, and further reducing the power consumption of the display device and prolonging the standby time of the display device.

On the other hand, with the development of technology, fingerprint identification is one of the important functions of display devices. Because there is a black matrix at the edge of the color filter and the light transmittance of the black matrix is very low (less than 10-5%), it cannot meet the requirements of optical fingerprint identification technology. In this regard, a first light-transmitting opening can be provided in the black matrix, so that the light reflected by the fingerprint can pass through the first light-transmitting opening and enter a corresponding optical fingerprint sensor, thus realizing optical fingerprint identification.

Figure 1:
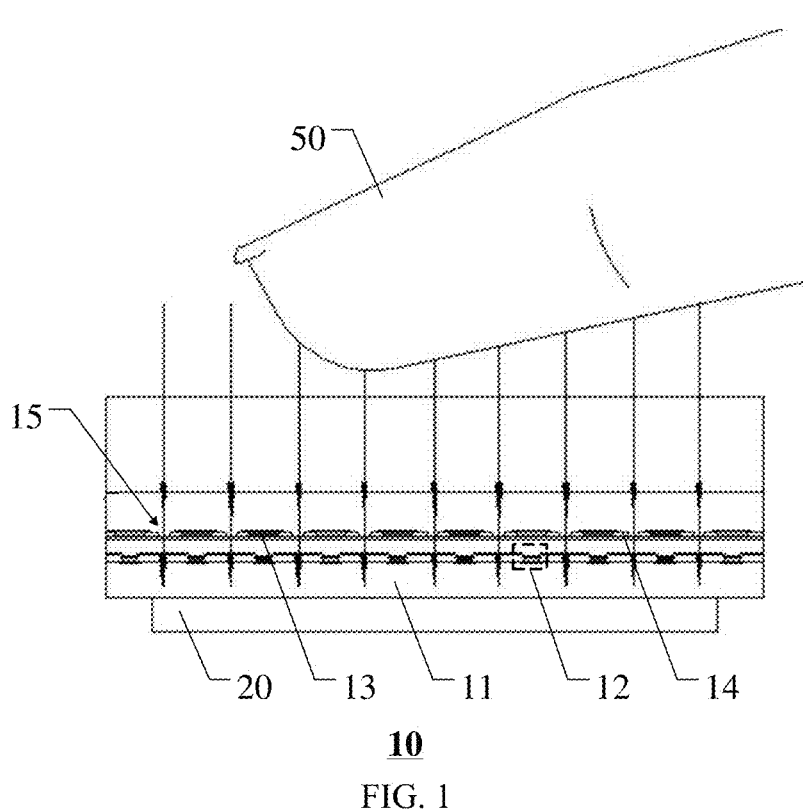
FIG. 1 is a schematic cross-sectional view of a display substrate.
Figure 2:
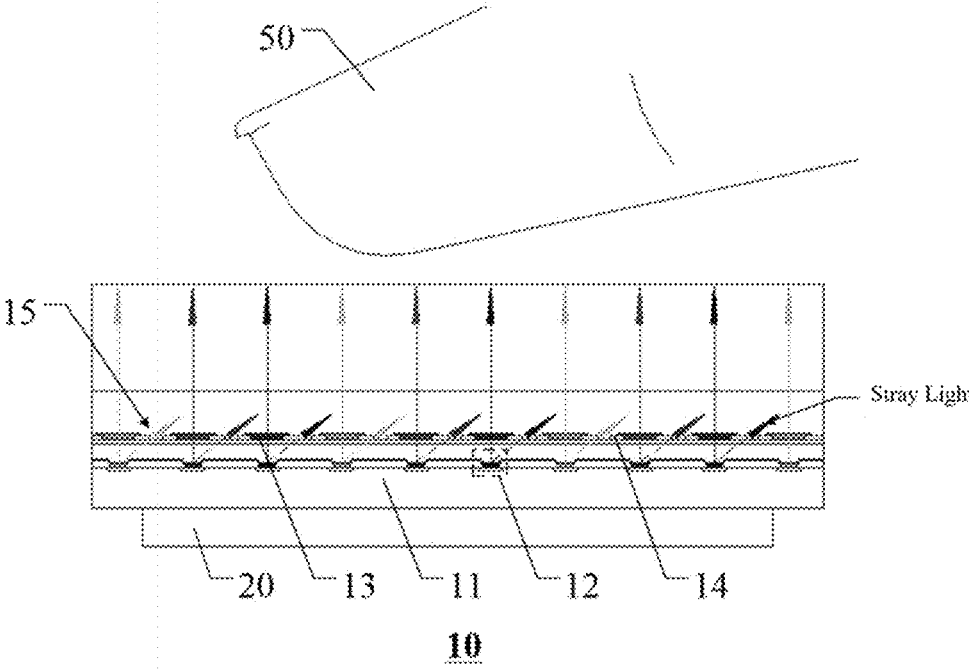
FIG. 2 is a schematic cross-sectional view of another display substrate.

FIG. 1 and FIG. 2 are schematic cross-sectional views of a display substrate. As shown in FIG. 1 and FIG. 2, the display substrate 10 includes a driving substrate 11, a light-emitting element 12, a color filter 13, and a black matrix 14; the light-emitting element 12 and the color filter 13 are arranged correspondingly, so that most of the light emitted by the light-emitting element 12 can pass through the color filter 13 and exit; the black matrix 14 is disposed between adjacent color filters 13. The display substrate 10 further includes a first light-transmitting opening 15 and an optical fingerprint sensor 20; the first light-transmitting opening 15 is located in the black matrix 14, and the optical fingerprint sensor 20 is located at a side of the driving substrate 11 away from the light-emitting element 12. In this case, the first light-transmitting opening 15 is also located between adjacent color filters 13.

As shown in FIG. 1, the light emitted by the display substrate 10 can be irradiated on the finger 50, and the light reflected by the finger 50 can be directed to the optical fingerprint sensor 20 through the first light-transmitting opening 15. The optical fingerprint sensor 20 can image the finger, thereby realizing fingerprint identification. However, as shown in FIG. 2, when the display substrate 10 displays, due to the existence of the first light-transmitting opening 15, part of the light emitted by the light-emitting element 12 can exit through the first light-transmitting opening 15 to form stray light, which affects normal display.

In this regard, in order to eliminate the stray light while realizing optical fingerprint identification, the embodiments of the present disclosure provide a display substrate and a display device. The display substrate includes a driving substrate, a plurality of light-emitting elements, a color filter layer, a first light-transmitting opening, an optical adhesive layer, and a cover plate; the plurality of light-emitting elements are located on the driving substrate; the color filter layer is located at a side of the plurality of light-emitting elements away from the driving substrate, and includes a plurality of color filters and a black matrix between adjacent color filters; the first light-transmitting opening is located in the black matrix; the optical adhesive layer is located at a side of the color filter layer away from the driving substrate; the cover plate is located at a side of the optical adhesive layer away from the optical adhesive layer, the plurality of light-emitting elements are arranged in one-to-one correspondence with the plurality of color filters, the distance between one light-emitting element and a corresponding color filter in the direction perpendicular to the driving substrate is a vertical distance a, the distance between the light-emitting element and the edge of the first light-transmitting opening adjacent to the corresponding color filter in the direction parallel to the driving substrate is a lateral distance b, and the vertical distance a and the lateral distance b satisfy a formula as follows:

$$0.866 \times \frac{n2}{n1} \ll \frac{a}{\sqrt{a^2 + b^2}},$$

where n1 is the refractive index of the cover plate and n2 is the refractive index of air.

In the display substrate provided by the embodiment of the present disclosure, by controlling the vertical distance between the light-emitting element and the corresponding color filter in the direction perpendicular to the driving substrate and the lateral distance between the light-emitting element and the edge of the first light-transmitting opening adjacent to the corresponding color filter in the direction parallel to the driving substrate, the display substrate can limit the emergent angle of stray light, and make the stray light be refracted at the interface between the display substrate and the air, so that the emergent angle of stray light is larger, and the influence of stray light on normal display can be avoided.

Hereinafter, the display substrate and the display device provided by the embodiments of the present disclosure will be described in detail with reference to the accompanying drawings.

Figure 3:
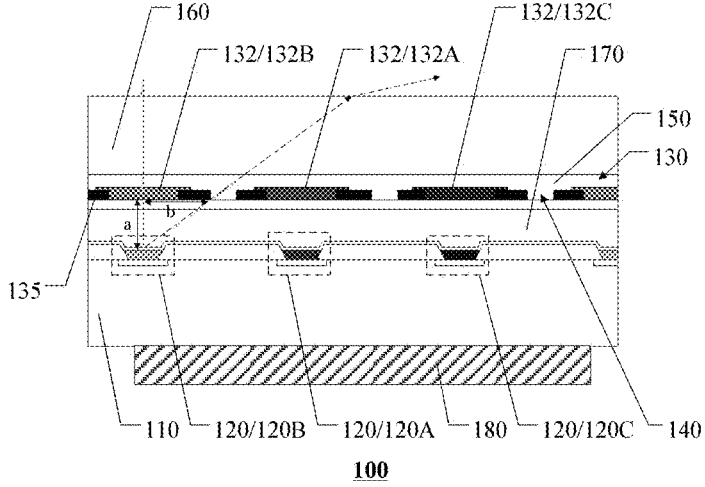
FIG. 3 is a schematic structural view of a display substrate provided by an embodiment of the present disclosure.

An embodiment of the present disclosure provides a display substrate. FIG. 3 is a schematic structural view of a display substrate provided by an embodiment of the present disclosure. As shown in FIG. 3, the display substrate 100 includes a driving substrate 110, a plurality of light-emitting elements 120, a color filter layer 130, a first light-transmitting opening 140, an optical adhesive layer 150, and a cover plate 160; the plurality of light-emitting elements 120 are located on the driving substrate 110; the color filter layer 130 is located at a side of the plurality of light-emitting elements 120 away from the driving substrate 110, and includes a plurality of color filters 132 and a black matrix 135 located between adjacent color filters 132; the first light-transmitting opening 140 is located in the black matrix 135; and for example, the first light-transmitting opening 140 penetrates the black matrix 135, so that light can pass through the black matrix 125 via the first light-transmitting opening 140. The optical adhesive layer 150 is located at a side of the color filter layer 130 away from the driving substrate 110; the cover plate 160 is located at a side of the optical adhesive layer 150 away from the color filter layer 130.

As shown in FIG. 3, the plurality of light-emitting elements 120 are arranged in one-to-one correspondence with the plurality of color filters 132, so that most of the light emitted by the light-emitting elements 120 can exit through the corresponding color filters 132. The distance between one light-emitting element 120 and a corresponding color filter 132 in the direction perpendicular to the driving substrate 110 is a vertical distance a, the distance between the light-emitting element 120 and the edge of the first light-transmitting opening 140 adjacent to the corresponding color filter 132 in the direction parallel to the driving substrate 110 is a lateral distance b, and the vertical distance a and the lateral distance b satisfy a formula as follows:

$$0.886 \times \frac{n2}{n1} \ll \frac{a}{\sqrt{a^2 + b^2}},$$

where n1 is the refractive index of the cover plate and n2 is the refractive index of air.

In the display substrate provided by the embodiment of the present disclosure, by controlling the vertical distance between the light-emitting element and the corresponding color filter in the direction perpendicular to the driving substrate and the lateral distance between the light-emitting element and the edge of the first light-transmitting opening adjacent to the corresponding color filter in the direction parallel to the driving substrate, the display substrate can limit the emergent angle of stray light, and make the stray light be refracted at the interface between the display substrate and the air, so that the emergent angle of stray light is larger. In this case, the user will not see stray light in a large viewing angle range (e.g., 120 degrees), so that the influence of stray light on normal display can be avoided.

On the other hand, the plurality of light-emitting elements are arranged in one-to-one correspondence with the plurality of color filters, so that most of the light emitted by the light-emitting elements can exit through the corresponding color filters, and therefore, the display substrate can further improve the light purity of different color sub-pixels (one sub-pixel can include a light-emitting element and a corresponding color filter) by using the color filters, so as to improve the display color gamut. On the other hand, the display substrate can also realize the anti-reflection function by using the color filter layer, so that the polarizer can be omitted, the light loss can be reduced, the power consumption can be reduced, and the standby time can be prolonged.

Figure 4:
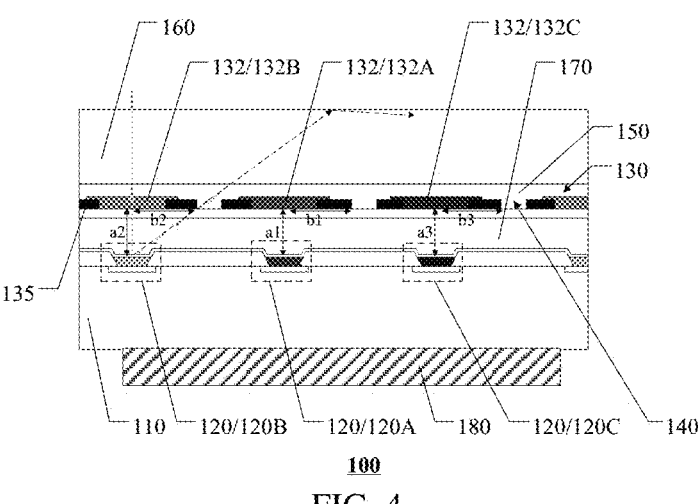
FIG. 4 is a schematic structural view of another display substrate provided by an embodiment of the present disclosure.

FIG. 4 is a schematic structural view of another display substrate provided by an embodiment of the present disclosure. As shown in FIG. 4, the display substrate 100 includes a driving substrate 110, a plurality of light-emitting elements 120, a color filter layer 130, a first light-transmitting opening 140, an optical adhesive layer 150, and a cover plate 160. The plurality of light-emitting elements 120 are located on the driving substrate 110; the color filter layer 130 is located at a side of the plurality of light-emitting elements 120 away from the driving substrate 110, and includes a plurality of color filters 132 and a black matrix 135 located between adjacent color filters 132; the first light-transmitting opening 140 is located in the black matrix 135; and for example, the first light-transmitting opening 140 penetrates the black matrix 135, so that light can pass through the black matrix 125 via the first light-transmitting opening 140. The optical adhesive layer 150 is located at a side of the color filter layer 130 away from the driving substrate 110; the cover plate 160 is located at a side of the optical adhesive layer 150 away from the color filter layer 130.

As shown in FIG. 4, the plurality of light-emitting elements 120 are arranged in one-to-one correspondence with the plurality of color filters 132, so that most of the light emitted by the light-emitting elements 120 can exit through the corresponding color filters 132. In this case, the distance between one light-emitting element 120 and a corresponding color filter 132 in the direction perpendicular to the driving substrate 110 is a vertical distance a, the distance between the light-emitting element 120 and the edge of the first light-transmitting opening 140 adjacent to the corresponding color filter 132 in the direction parallel to the driving substrate 110 is a lateral distance b, and the vertical distance a and the lateral distance b satisfy a formula as follows:

$$\frac{n2}{n1} \ll \frac{a}{\sqrt{a^2+b^2}}.$$

In the display substrate provided by the present exemplary embodiment, by controlling the vertical distance between the light-emitting element and the corresponding color filter in the direction perpendicular to the driving substrate and the lateral distance between the light-emitting element and the edge of the first light-transmitting opening adjacent to the corresponding color filter in the direction parallel to the driving substrate, the display substrate can limit the emergent angle of stray light, and make the stray light be totally reflected at the interface between the display substrate and the air, so that the stray light cannot exit, and the influence of stray light on normal display can be avoided.

In some exemplary embodiments, the vertical distance a and the lateral distance b satisfy a formula as follows:

$$\frac{2}{3} \ll \frac{a}{\sqrt{a^2+b^2}}.$$

In the display substrate provided by the present exemplary embodiment, by controlling the vertical distance between the light-emitting element and the corresponding color filter in the direction perpendicular to the driving substrate and the lateral distance between the light-emitting element and the edge of the first light-transmitting opening adjacent to the corresponding color filter in the direction parallel to the driving substrate, the display substrate can limit the emergent angle of stray light, and make the stray light be totally reflected at the interface between the display substrate and the air, so that the stray light cannot exit, and the influence of stray light on normal display can be avoided.

In some exemplary embodiments, the driving substrate 110 can include a rigid substrate such as a glass substrate, a quartz substrate, a plastic substrate, etc., or can include a flexible substrate such as a polyimide substrate, etc. In addition, the driving substrate can also be a silicon-based semiconductor substrate.

In some exemplary embodiments, in addition to the above-mentioned substrate, the driving substrate 110 can further include a pixel driving circuit configured for driving the light-emitting element 120 to emit light, a data line, a power line and other structures. These structures can refer to the common design, which will not be repeated in the embodiment of the present disclosure.

In some exemplary embodiments, as shown in FIG. 3 and FIG. 4, the display substrate 100 can further include an encapsulation layer 170, and the encapsulation layer 170 is located at a side of the plurality of light-emitting elements 120 away from the driving substrate 110; and in this case, the color filter layer 130 is disposed at a side of the encapsulation layer 170 away from the driving substrate. Therefore, the display substrate is formed with a flat surface through the encapsulation layer, which facilitates the formation of the color filter layer 130 and improves the alignment accuracy between the color filters 132 and the corresponding light-emitting element 120.

In some exemplary embodiments, the refractive index of the cover plate 160 is less than or equal to 1.55. Therefore, in the case where a user attaches a protective film to the surface of a display device using the display substrate, because the refractive index of the cover plate is less than or equal to 1.55, the display substrate can prevent the emergent angle of stray light from becoming smaller after the stray light is refracted at the interface between the cover plate and the protective film.

In some exemplary embodiments, as shown in FIG. 3 and FIG. 4, the plurality of light-emitting elements 120 include a first light-emitting element 120A, a second light-emitting element 120B, and a third light-emitting element 120C, and the plurality of color filters 132 include a first filter 132A, a second filter 132B, and a third filter 132C; the first filter 132A is configured to allow light of a first color to pass through, the second filter 132B is configured to allow light of a second color to pass through, and the third filter 132C is configured to allow light of a third color to pass through, the first light-emitting element 120A is arranged corresponding to the first filter 132A, the second light-emitting element 120B is arranged corresponding to the second filter 132B, and the third light-emitting element 120C is arranged corresponding to the third filter 132C. Therefore, the display substrate can further improve the purity of light emitted by the first light-emitting element by using the first filter, further improve the purity of light emitted by the second light-emitting element by using the second filter, and further improve the purity of light emitted by the third light-emitting element by using the third filter. Thus, the display color gamut of the display substrate can be improved.

In some exemplary embodiments, the first light-emitting element 130A is configured to emit light of the first color, the second light-emitting element 120B is configured to emit light of the second color, and the third light-emitting element 120C is configured to emit light of the third color. Of course, the embodiment of the present disclosure includes but is not limited to this case, and the first light-emitting element, the second light-emitting element, and the third light-emitting element can also emit white light.

In some exemplary embodiments, the first color is red, the second color is green, and the third color is blue. Of course, the embodiment of the present disclosure includes but is not limited to this case.

In some exemplary embodiments, as shown in FIG. 3 and FIG. 4, the distance between one first light-emitting element 120A and a corresponding first color filter 132A in the direction perpendicular to the driving substrate 110 is a first vertical distance a1, and the distance between the first light-emitting element 120A and the edge of the first light-transmitting opening 140 adjacent to the corresponding first color filter 132A in the direction parallel to the driving substrate is a first lateral distance b1; the distance between one second light-emitting element 120B and a corresponding second color filter 132B in the direction perpendicular to the driving substrate 110 is a second vertical distance a2, and the distance between the second light-emitting element 120B and the edge of the first light-transmitting opening 140 adjacent to the corresponding second color filter 132B in the direction parallel to the driving substrate 110 is a second lateral distance b2; the distance between one third light-emitting element 120C and a corresponding third color filter 132C in the direction perpendicular to the driving substrate 110 is a third vertical distance a3, and the distance between the third light-emitting element 120C and the edge of the first light-transmitting opening 140 adjacent to the corresponding third color filter 132C in the direction parallel to the driving substrate 110 is a third lateral distance b3; and the first lateral distance b1, the second lateral distance b2, and the third lateral distance b3 are different from each other.

In the display substrate provided by the present exemplary embodiment, because the wavelengths of light of different colors are different, the refractive index of light of different colors at the cover plate will also be different. By setting the first lateral distance b1, the second lateral distance b2, and the third lateral distance b3 to be different from each other, in the display substrate, the sub-pixels of different colors can adopt different lateral distances, so that the space on the display substrate can be used more reasonably.

In some exemplary embodiments, because human eyes are sensitive to green light, in the display substrate, it can firstly ensure that the emergent angle of green stray light is large or the green stray light is totally reflected at the interface between the cover plate and the air.

In some exemplary embodiments, the first vertical distance a1, the first lateral distance b1, the second vertical distance a2, the second lateral distance b2, the third vertical distance a3, and the third lateral distance b3 satisfy a formula as follows:

$$\frac{a3}{\sqrt{a3^2 + b3^2}} \ll \frac{a2}{\sqrt{a2^2 + b2^2}} \ll \frac{a1}{\sqrt{a1^2 + b1^2}}.$$

In the display substrate provided by the present exemplary embodiment, by making a1, b1, a2, b2, a3 and b3 satisfy the above-mentioned size relationship, in the display substrate, the area on the display substrate can be used as reasonably as possible on the premise of ensuring that stray light of various colors does not affect the normal display. For example, the first lateral distance b1 between the first light-emitting element and the edge of the first light-transmitting opening adjacent to the corresponding first filter in the direction parallel to the driving substrate can be set smaller, and the size of the first light-transmitting opening adjacent to the corresponding first filter can be increased, thereby increasing the area of the first light-transmitting opening on the premise of ensuring that stray light of various colors does not affect the normal display; and therefore, the light input of the optical fingerprint identification sensor is increased, and further, the fingerprint identification performance is improved.

In some exemplary embodiments, as shown in FIG. 3 and FIG. 4, the size of the first light-transmitting opening 140 between the first color filter 132A and the second color filter 132B is greater than the size of the first light-transmitting opening 140 between the first color filter 132A and the third color filter 132C. Because the first lateral distance b1 and the second lateral distance b2 can be set less than the third lateral distance b3, the size of the first light-transmitting opening between the first color filter and the second color filter can be greater than the size of the first light-transmitting opening between the first color filter and the third color filter.

In some exemplary embodiments, as shown in FIG. 3 and FIG. 4, the size of the first light-transmitting opening between the first filter and the second filter is greater than the size of the first light-transmitting opening between the second filter and the third filter. Because the first lateral distance b1 and the second lateral distance b2 can be set less than the third lateral distance b3, the size of the first light-transmitting opening between the first filter and the second filter can be greater than the size of the first light-transmitting opening between the second filter and the third filter.

In some exemplary embodiments, the first vertical distance a1, the first lateral distance b1, the second vertical distance a2, the second lateral distance b2, the third vertical distance a3, and the third lateral distance b3 satisfy a formula as follows:

$$\frac{a1}{\sqrt{a1^2 + b1^2}} : \frac{a2}{\sqrt{a2^2 + b2^2}} : \frac{a2}{\sqrt{a2^2 + b2^2}} = 10: 8.5: 7.$$

In some exemplary embodiments, each light-emitting element 120 includes an anode 121, an organic light-emitting layer 122, and a cathode 123. Therefore, the light-emitting element 120 can be an organic light-emitting element. It should be noted that each light-emitting element can further include auxiliary functional layers for assisting light emission, such as an electron transport layer, a hole transport layer, etc.

In some exemplary embodiments, as shown in FIG. 3 and FIG. 4, the display substrate 100 can further include an optical sensor 180; and the optical sensor 180 is located at a side of the driving substrate 110 away from the light-emitting elements 120. Therefore, the optical sensor can realize various functions, such as fingerprint identification, face identification, distance sensing and the like, through the light incident from the first light-transmitting opening.

In some exemplary embodiments, the optical sensor can include at least one selected from the group consisting of an optical fingerprint identification sensor, a face identification sensor, an infrared sensor and a distance sensor.

For example, in the case where the optical sensor is an optical fingerprint identification sensor, the light reflected by a finger or fingerprints can be indent onto the optical fingerprint identification sensor through the first light-transmitting opening, thereby realizing the fingerprint identification function.

In some exemplary embodiments, as shown in FIG. 3 and FIG. 4, the orthographic projection of the first light-transmitting opening 140 on the driving substrate 110 falls within the orthographic projection of the optical fingerprint identification sensor 180 on the driving substrate 110.

Figure 5:
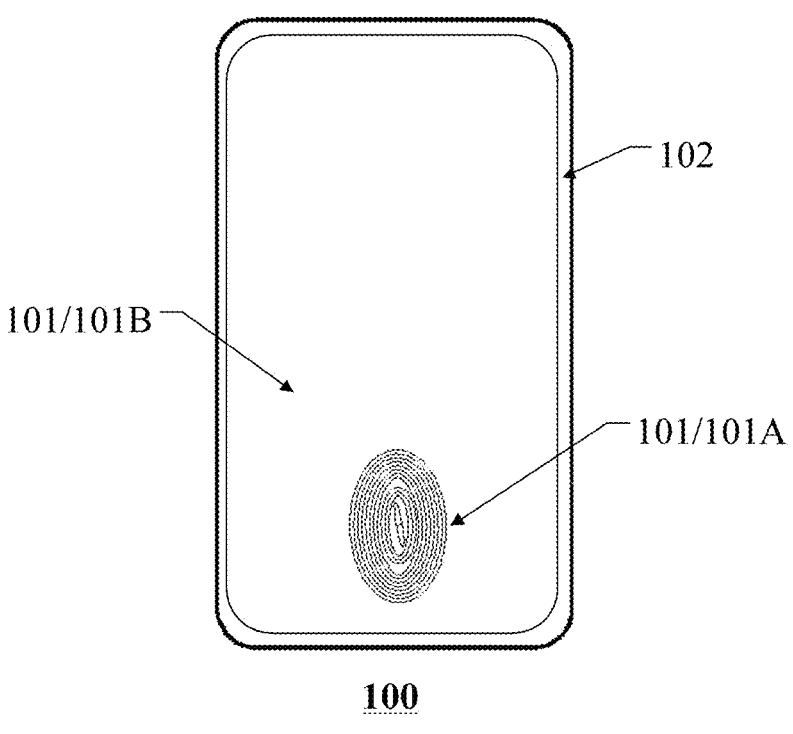
FIG. 5 is a schematic plan view of a display substrate provided by an embodiment of the present disclosure.

FIG. 5 is a schematic plan view of a display substrate provided by an embodiment of the present disclosure. As shown in FIG. 5, the display substrate 100 includes a display region 101 and a non-display region 102 surrounding the display region 101; the display region 101 includes a fingerprint identification region 101A and a normal display region 101B located at the outer side of the fingerprint identification region 101A; and the first light-transmitting opening 140 is located in the fingerprint identification region 101A.

Figure 6:
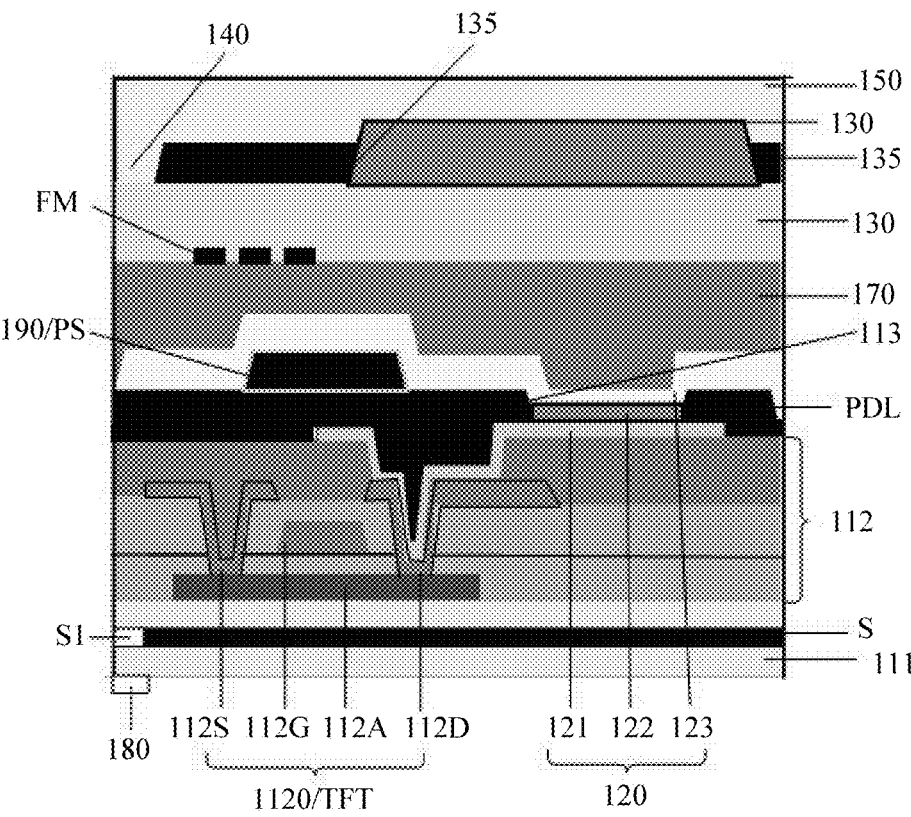
FIG. 6 is a schematic partial cross-sectional view of a display substrate provided by at least one embodiment of the present disclosure.
Figure 7:
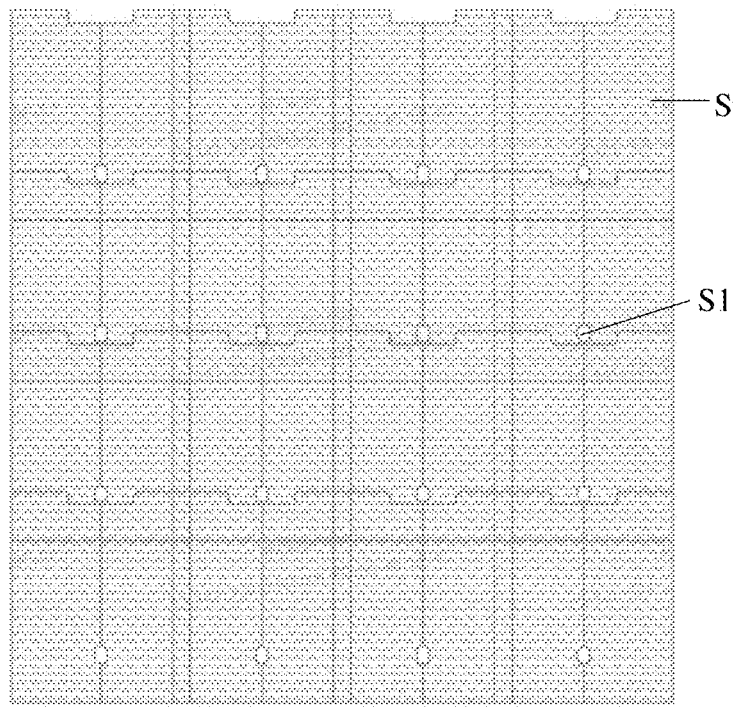
FIG. 7 is a schematic partial plan view of a light-shielding layer in a display substrate provided by at least one embodiment of the present disclosure.

FIG. 6 is a schematic partial cross-sectional view of a display substrate provided by an embodiment of the present disclosure, and FIG. 7 is a schematic partial plan view of a light-shielding layer in a display substrate provided by an embodiment of the present disclosure. As shown in FIG. 6 and FIG. 7, the driving substrate 110 includes a base substrate 111, a light-shielding layer S, a pixel driving circuit layer 112, and a pixel defining layer PDL; the light-shielding layer S is disposed on the base substrate 111 and includes a plurality of second light-transmitting openings S1; the pixel driving circuit layer 112 is disposed at a side of the light-shielding layer S away from the base substrate 111; the pixel defining layer PDL is disposed at a side of the pixel driving circuit layer 112 away from the base substrate 111 and includes a plurality of sub-pixel openings 113. The pixel driving circuit layer 112 includes a plurality of pixel driving circuits 1120, the plurality of pixel driving circuits 1120 are electrically connected with the plurality of light-emitting elements 120 and configured to drive the plurality of light-emitting elements 120 to emit light, the plurality of light-emitting elements 120 are disposed in the plurality of sub-pixel openings 113 and form a plurality of sub-pixels 200 with the plurality of pixel driving circuits 1120; the orthographic projections of at least part of the plurality of second light-transmitting openings S1 on the base substrate 110 overlap with the orthographic projection of the first light-transmitting opening 140 on the base substrate 110.

For example, each pixel driving circuit 1120 includes components such as a thin film transistor TFT and a storage capacitor (not shown), etc., and can be formed into a 3T1C structure, 4T1C structure, 5T1C structure, 5T2C structure, 6T1C structure, 7T1C structure or 8T1C structure, etc., which will be described in detail later. For example, as shown in FIG. 6, the thin film transistor TFT includes an active layer 112A, a gate electrode 112G, a first electrode 112D and a second electrode 112S, etc. The light-emitting element 120 includes a first electrode 121, a light-emitting material layer 122, and a second electrode 123. For example, the first electrode 121 serves as an anode and is electrically connected with the first electrode 112D of the thin film transistor TFT. The light-emitting material layer 122 includes an organic light-emitting material, and is configured to emit monochromatic light or white light. The second electrode 123 serves as a cathode, and is formed into, for example, a surface electrode, that is, the second electrodes 123 of the plurality of sub-pixels are continuously arranged in a surface shape so as to cover the base substrate 111 as a whole; alternatively, in some embodiments, the second electrode 123 can have a pattern opposite to the first electrode 121 at the position where the light transmittance of the display substrate needs to be improved, that is, the second electrode 123 is patterned to improve the light transmittance of the display substrate at this position.

For example, as shown in FIG. 6, the orthographic projections of the plurality of second light-transmitting openings S1 on the base substrate 111 are respectively located between the orthographic projections of adjacent sub-pixel openings 113 among the plurality of sub-pixel openings 113 on the base substrate 111; the orthographic projections of at least part of the plurality of second light-transmitting openings S1 on the base substrate 110 overlap with the orthographic projection of the first light-transmitting opening 140 on the base substrate 110.

For example, the material of the light-shielding layer S can be a metal material such as copper and aluminum, etc., or an alloy material; alternatively, in some embodiments, the light-shielding layer S can also be a light-shielding layer formed by adding black dye to a resin material, so as to fully realize the light-shielding effect.

In the embodiment of the present disclosure, the light-shielding layer S can transmit the signal light for fingerprint identification at the second light-transmitting opening S1, and shield the non-signal light, such as the light emitted by the light-emitting element 120 of the display substrate and ambient light, at other positions, so as to prevent the non-signal light from irradiating the optical sensor disposed at the non-display side of the display substrate, thereby improving the identification speed and accuracy of the optical sensor.

For example, in some embodiments, as shown in FIG. 6, the display substrate further includes a black matrix 135 disposed at a side of the light-emitting elements 120 away from the base substrate 111.

Figure 8:
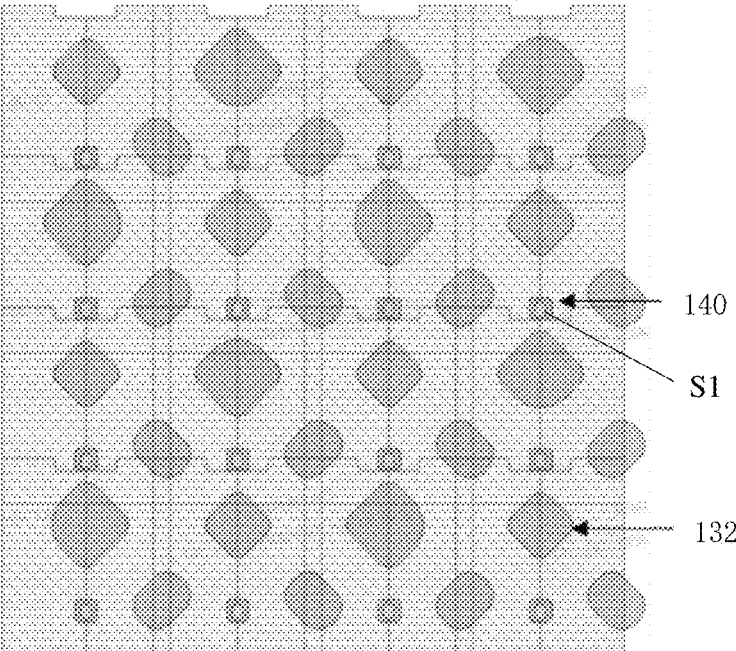
FIG. 8 is a schematic partial plan view illustrating stacked layers of a light-shielding layer and a color filter layer in a display substrate provided by at least one embodiment of the present disclosure.

FIG. 8 is a schematic partial plan view illustrating stacked layers of a light-shielding layer and a black matrix in a display substrate provided by at least one embodiment of the present disclosure; FIG. 9 is a schematic partial plan view illustrating stacked layers of a light-shielding layer, a black matrix, and color filters in a display substrate provided by at least one embodiment of the present disclosure. For example, FIG. 8 shows a schematic diagram in which the black matrix 135 of the display substrate is stacked on the light-shielding layer S, and FIG. 9 shows a schematic diagram in which the black matrix 135 the pixel defining layer PDL, and the color filters 132 of the display substrate are stacked.

For example, as shown in FIG. 8 and FIG. 9, the orthographic projections of the plurality of sub-pixel openings 113 on the base substrate 111 are at least partially overlapped with the orthographic projections of the plurality of color filters 132 on the base substrate 111, and for example, the orthographic projections of the plurality of sub-pixel openings 113 on the base substrate 111 are respectively located within the orthographic projections of the plurality of color filters 132 on the base substrate 111.

For example, as shown in FIG. 9, the distance b (b1) between the orthographic projection of the sub-pixel opening 113 on the base substrate 111 and the orthographic projection of the color filter 132 on the base substrate 111 is in the range of 1 micron to 6.5 microns, such as 1 micron to 5 microns, such as 1 micron to 3.5 microns, such as 1 micron to 2 microns, such as 1.0 micron, 1.2 microns, 1.5 microns, 1.7 microns, or 2 microns etc.

For example, as shown in FIG. 8 and FIG. 9, the plurality of first light-transmitting openings 140 are respectively arranged between adjacent color filters 132 among the plurality of color filters 132, and the orthographic projections of at least part of the second light-transmitting openings among the plurality of second light-transmitting openings S1 on the base substrate 111 are at least partially overlapped with the orthographic projections of the plurality of first light-transmitting openings 140 on the base substrate 111, respectively.

Therefore, the second light-transmitting opening S1 and the first light-transmitting opening 140 form an overlap hole to transmit, for example, the signal light for fingerprint identification. In this case, an optical sensor 180 (or a sensor such as a camera, a distance sensor, an infrared sensor, etc.) can be disposed at a side of the base substrate 111 away from the light-emitting elements 120, and the optical sensor 180 can receive the signal light passing through the first light-transmitting opening 140 and the second light-transmitting opening S, so as to perform print collection and identification.

For example, in some embodiments, the pixel driving circuit layer includes a plurality of metal layers, such as the metal layers where the gate electrode 112G, the first electrode 112D, and the second electrode 112S are located. The orthographic projections of the circuit patterns formed by these metal layers on the base substrate 111 does not overlap with the orthographic projections of the plurality of second light-transmitting openings S1 on the base substrate 111, and does not overlap with the orthographic projections of the first light-transmitting openings 140 on the base substrate 111, so as to prevent the circuit patterns from affecting transmission of the signal light.

For example, as shown in FIG. 8, the orthographic projections of at least part of the second light-transmitting openings S1 among the plurality of second light-transmitting openings S1 on the base substrate 111 are located within the orthographic projections of the plurality of first light-transmitting openings 140 on the base substrate 111, respectively.

FIG. 10 shows a schematic view illustrating stacked layers of a second light-transmitting opening S1 and a corresponding first light-transmitting opening 140. As shown in FIG. 10, the distances L3 between the boundaries of orthographic projections of at least part of the plurality of second light-transmitting openings S1 on the base substrate 111 and the boundaries of the orthographic projections of the plurality of first light-transmitting openings 140 on the base substrate 111 are in the range of 0.5 micron to 1.5 microns, such as 0.8 micron, 1.0 micron, 1.2 microns or 1.5 microns, etc.

For example, in some embodiments, as shown in FIG. 6 and FIG. 9, the plurality of sub-pixels include a first sub-pixel R, a second sub-pixel G, and a third sub-pixel B, and the plurality of color filters 132 include a first filter 132A, a second filter 132B, and a third filter 132C.

The orthographic projection of the sub-pixel opening 113 of the first sub-pixel R on the base substrate 111 is located within the orthographic projection of the first filter 132A on the base substrate 111, so that the light emitted by the light-emitting element of the first sub-pixel R can exit through the first filter 132A. The orthographic projection of the sub-pixel opening 113 of the second sub-pixel G on the base substrate 111 is located within the orthographic projection of the second filter 132B on the base substrate 111, so that the light emitted by the light-emitting element of the second sub-pixel G can exit through the second filter 132B. The orthographic projection of the sub-pixel opening 113 of the third sub-pixel B on the base substrate 111 is located within the orthographic projection of the third filter 132C on the base substrate 111, so that the light emitted by the light-emitting element of the third sub-pixel B can exit through the third filter 132C.

For example, as shown in FIG. 9, at least part of the first light-transmitting openings 140 are located between color filters 132 corresponding to the first sub-pixel R and the third sub-pixel B adjacent to each other, the minimum distance between the at least part of the first light-transmitting openings 140 and the color filter 132 corresponding to the first sub-pixel R is a first distance D1, the minimum distance between the at least part of the first light-transmitting openings 140 and the color filter 132 corresponding to the third sub-pixel B is a second distance D2, and the first distance D1 is different from the second distance D2. For example, the first distance D1 is less than the second distance D2, that is, the first light-transmitting opening 140 between the first sub-pixel R and the third sub-pixel B adjacent to each other is closer to the third sub-pixel B.

For example, as shown in FIG. 9, the first sub-pixels R and the third sub-pixels B are arranged in rows and columns, and first sub-pixels R and third sub-pixels B which are located in the same column are alternately arranged, and a first light-transmitting opening 140 is disposed between the color filters 132 corresponding to the first sub-pixel R and the third sub-pixels B adjacent to each other and located in the same column, that is, the first light-transmitting opening 140 is disposed between the color filters 132 of the first sub-pixel R and the third sub-pixel B adjacent to each other in the column direction.

For example, FIG. 9 also shows an enlarged view of the sub-pixel opening 113, the color filter 132, and the third filter 132C corresponding to the third sub-pixel B, and an adjacent first light-transmitting opening 140. The structures shown in other frame regions in FIG. 9 are basically the same as those of this enlarged part. As shown in FIG. 9, in terms of the sub-pixel opening 113 and the third filter 132C corresponding to the third sub-pixel B, the orthographic projection of the sub-pixel opening 113 on the base substrate 111 is located within the orthographic projection of the third filter 132C on the base substrate 111. In addition, the distance b+d between the boundary of the orthographic projection of the sub-pixel opening 113 on the base substrate 111 and the boundary of the orthographic projection of the third filter 132C on the base substrate 111 at the side close to the adjacent first light-transmitting opening 140 is less than the distance b1+e between the boundary of the orthographic projection of the sub-pixel opening 113 on the base substrate 111 and the boundary of the orthographic projection of the third filter 132C on the base substrate 111 at the side away from the first light-transmitting opening 140, that is, the third filter 132C is shifted away from the first light-transmitting opening 140, so as to avoid the third filter 132C from covering the first light-transmitting opening 140 due to alignment errors in the manufacturing process.

For example, as shown in FIG. 9, in terms of the sub-pixel opening 113 and the color filter 132 corresponding to the third sub-pixel B, the orthographic projection of the sub-pixel opening 113 on the base substrate 111 is located within the orthographic projection of the color filter 132 on the base substrate 111. In addition, the distance b between the boundary of the orthographic projection of the sub-pixel opening 113 on the base substrate 111 and the boundary of the orthographic projection of the color filter 132 on the base substrate 111 at the side close to the first light-transmitting opening 140 is less than the distance b1 between the boundary of the orthographic projection of the sub-pixel opening 113 on the base substrate 111 and the boundary of the orthographic projection of the color filter 132 on the base substrate 111 at the side away from the first light-transmitting opening 140, that is, the color filter 132 is also shifted away from the first light-transmitting opening 140. For example, in some embodiments, b is in the range of 0.5 micron to 1.5 microns, such as 1.0 micron; and b1 is in the range of 1.0 micron to 2.0 microns, such as 1.5 microns. Alternatively, b is 1.2 microns, b1 is 1.7 microns, and so on.

For example, as shown in FIG. 9, in terms of the color filter 132 corresponding to the third sub-pixel B and the adjacent first light-transmitting opening 140, the distance a between the boundary of the orthographic projection of the color filter 132 on the base substrate 111 and the boundary of the orthographic projection of the first light-transmitting opening 140 on the base substrate 111 is greater than or equal to 4 microns. If the distance between the color filter 132 and the first light-transmitting opening 140 is too small, on the one hand, the light emitted by the light-emitting element 120 may leak into the first light-transmitting opening 140 to cause interference; on the other hand, the color filter layer is easy to be continuous at the color filter 132 and the first light-transmitting opening 140 in the manufacturing process, so it is difficult to form the color filter 132 and the first light-transmitting opening 140 which are separated from each other.

For example, as shown in FIG. 9, in terms of the third filter 132C corresponding to the third sub-pixel B and the adjacent first light-transmitting opening 140, the distance c between the boundary of the orthographic projection of the third filter 132C on the base substrate 111 and the boundary of the orthographic projection of the first light-transmitting opening 140 on the base substrate 111 is greater than or equal to 0, for example, greater than 0.5 micron. Therefore, the third filter 132C will not cover the first light-transmitting opening 140 to avoid interference on the signal light transmitted through the first light-transmitting opening 140.

For example, as shown in FIG. 9, in terms of the third filter 132C and the color filter 132 corresponding to the third sub-pixel B, at a side close to the first light-transmitting opening 140, the distance d between the boundary of the orthographic projection of the third filter 132C on the base substrate 111 and the boundary of the orthographic projection of the color filter 132 on the base substrate 111 is greater than or equal to 2 microns, that is, the third filter 132C exceeds the color filter 132 by a distance greater than or equal to 2 microns, so as to increase the contact area between the third filter 132C and the black matrix 135 and to prevent the third filter 132C from peeling from the color filter 132.

For example, at the side away from the first light-transmitting opening 140, the distance e between the boundary of the orthographic projection of the third filter 132C on the base substrate 111 and the boundary of the orthographic projection of the color filter 132 on the base substrate 111 is greater than or equal to 3 microns, which is greater than d. Therefore, in the manufacturing process, once the third filter 132C is peeled off from the color filter 132 due to a small d value, the third filter 132C can be moved as a whole to increase the d value to avoid the peeling phenomenon and ensure that the production can continue.

For example, as shown in FIG. 9, in terms of the sub-pixel opening 113 and the first filter 132A corresponding to the first sub-pixel R, the orthographic projection of the sub-pixel opening 113 on the base substrate 111 is located within the orthographic projection of the first filter 132A on the base substrate 111, and the distance f between the boundary of the orthographic projection of the sub-pixel opening 113 on the base substrate 111 and the boundary of the orthographic projection of the first filter 132A on the base substrate 111 at the side close to the first light-transmitting opening 140 is basically equal to the distance g between the boundary of the orthographic projection of the sub-pixel opening 113 on the base substrate 111 and the boundary of the orthographic projection of the first filter 132A on the base substrate 111 at the side away from the first light-transmitting opening 140.

For example, as shown in FIG. 9, one first sub-pixel R, two second sub-pixels G and one third sub-pixel B form a repeating unit, a plurality of repeating units are arranged in an array, and the plurality of second sub-pixels G in the plurality of repeating units are arranged in rows and columns. The first light-transmitting openings 140 are also disposed between the color filters 132 corresponding to adjacent second sub-pixels G in the row direction. For example, the first light-transmitting opening 140 has basically the same distance from the color filters 132 corresponding to the adjacent second sub-pixels G in the row direction.

For example, in some embodiments, the first sub-pixel R is a red sub-pixel, the second sub-pixel G is a green sub-pixel, and the third sub-pixel B is a blue sub-pixel; the first filter 132A is a red filter, the second filter 132B is a green filter, and the third filter 132C is a blue filter.

Alternatively, in some other embodiments, the first sub-pixel R can also be a green sub-pixel or a blue sub-pixel, the second sub-pixel G can also be a red sub-pixel or a blue sub-pixel, and the third sub-pixel B can also be a red sub-pixel or a green sub-pixel. In this case, the color filter with a corresponding color is disposed on each sub-pixel.

For example, in some embodiments, as shown in FIG. 8 and FIG. 9, each repeating unit (e.g., as shown in the quadrangular dashed frame in FIG. 9) is correspondingly provided with two second light-transmitting openings S1 and two first light-transmitting openings 140; the orthographic projections of the two second light-transmitting openings S1 on the base substrate 111 should be located within the orthographic projections of the two first light-transmitting openings 140 on the base substrate 111, respectively.

For example, in some other embodiments, each repeating unit is correspondingly provided with two second light-transmitting openings S1, and each repeating unit or multiple repeating units are correspondingly provided with one first light-transmitting opening 140. In this case, the orthographic projections of some second light-transmitting openings S1 among the plurality of second light-transmitting openings S1 on the base substrate 111 should be located within the orthographic projections of the plurality of first light-transmitting openings 140 on the base substrate 111, respectively. That is, in the above embodiments, some second light-transmitting openings S1 and the first light-transmitting openings 140 form overlap holes used for transmitting the signal light, while other second light-transmitting openings S1 are not used for transmitting the signal light. In the present embodiment, because the number of the first light-transmitting openings 140 is less than the number of the second light-transmitting openings S1, the positions of the first light-transmitting openings 140 can be set flexibly. In this case, in some embodiments, the third filter 132C corresponding to the third sub-pixel B may not be set in a shift manner as shown in FIG. 9.

For example, as shown in FIG. 6, the display substrate further includes a spacer layer 190 disposed at a side of the pixel defining layer PDL away from the base substrate 111, and the spacer layer 190 includes a plurality of spacers PS. The plurality of spacers PS can support components, such as a mask plate, etc., during the manufacturing process of the display substrate.

FIG. 11 shows a schematic plan view of the arrangement of the plurality of spacers. As shown in FIG. 11, in some embodiments, the orthographic projections of the plurality of spacers PS on the base substrate 111 are respectively located between the orthographic projections of the sub-pixel openings 113 of the adjacent second sub-pixel G in the column direction on the base substrate 111, and between the orthographic projections of the sub-pixel openings 113 of the first sub-pixel R and the third sub-pixel G adjacent to each other in the row direction on the base substrate 111.

For example, in some embodiments, the minimum distance between the plurality of spacers PS and the plurality of sub-pixel openings 113 is L, and 1 micron<L<8 microns. For example, L is 2 microns, 4 microns, 6 microns or 8 microns, etc. Therefore, the plurality of spacers PS are separated from the plurality of sub-pixel openings 113 by a certain distance. Because the sidewall of the sub-pixel opening 113 usually have a certain inclination angle, if the distance between the plurality of spacers PS and the plurality of sub-pixel openings 113 is too close, the spacer PS may be formed on the sidewall of the sub-pixel opening 113, thus reducing the height of the spacer PS relative to the base substrate 111, and it is difficult to achieve a sufficient spacer function.

For example, in some embodiments, as shown in FIG. 11, the planar shape of at least part of the spacers PS among the plurality of spacers PS is a rectangle. For example, each of the length L1 and width W1 of the rectangle ranges from 13 microns to 19 microns. For example, the length L1 can be 15 microns, 17 microns or 19 microns, etc., and the width W1 can be 13 microns, 15 microns or 17 microns, etc. In some embodiments, the planar shape of at least part of the spacers PS can also be a square, and in this case, the side length of the square can be 12 microns, 15 microns, 17 microns or 19 microns, etc.

For example, in some other embodiments, the planar shape of at least part of the spacers PS among the plurality of spacers PS can also be a circle, and in this case, the diameter of the circle can be in the range of 13 microns to 19 microns, such as 15 microns or 17 microns, etc. Alternatively, in some other embodiments, the plurality of spacers PS can include a main spacer and an auxiliary spacer, and the planar shapes of both the main spacer and the auxiliary spacer can be circles. In this case, the sum of the diameters of the circles of the main spacer and the auxiliary spacer can be in the range of 13 microns to 19 microns, such as 15 microns or 17 microns, etc.

For example, as shown in FIG. 6, in the direction perpendicular to the base substrate 111, that is, in the vertical direction in the figure, each of the heights of the plurality of spacers PS is in the range of 0.5 micron to 2.0 microns, such as 1.0 micron or 1.5 microns, etc., so as to fully realize the spacer function.

For example, as shown in FIG. 11, the shortest distance L11 between the orthographic projection of each of the plurality of spacers PS on the base substrate 111 and the orthographic projection of the sub-pixel opening 113 of the first sub-pixel R in the first sub-pixel R and the third sub-pixel B that are adjacent to each other on the base substrate 111 is greater than the shortest distance L12 between the orthographic projection of the each of the plurality of spacers PS on the base substrate 111 and the orthographic projection of the sub-pixel opening 113 of the third sub-pixel B in the first sub-pixel R and the third sub-pixel B that are adjacent to each other on the base substrate 111. That is, the spacer PS disposed between the first sub-pixel R and the third sub-pixel B adjacent to each other is closer to the sub-pixel opening 113 of the third sub-pixel B than to the sub-pixel opening 113 of the first sub-pixel R.

For example, in some embodiments, as shown in FIG. 11, the orthographic projection of each of the plurality of spacers PS on the base substrate 111 has basically the same shortest distance L13 to the orthographic projections of the sub-pixel openings 113 of the adjacent second sub-pixels G on the base substrate 111, that is, the spacer PS disposed between the adjacent second sub-pixels G has basically the same distance from the sub-pixel openings 113 of the adjacent second sub-pixels G.

For example, in some embodiments, the light transmittance of the material of the spacer layer 190 is less than 5%, such as less than 2%. For example, the plurality of spacers PS can be formed of a black opaque material, such as a black opaque material formed by doping black dye in a resin material, which has a good light absorption effect. Therefore, when external ambient light is irradiated on the spacer PS, the external ambient light is not reflected but absorbed, so the color separation phenomenon can be weakened or even eliminated.

For example, in some embodiments, the light transmittance of the material of the pixel defining layer PDL is less than 5%, such as less than 2%. For example, the material of the pixel defining layer PDL can be the same as the material of the plurality of spacers PS, so that they can be formed in the same patterning process by using a halftone mask in the manufacturing process, or they can be formed by using the same material or different materials, respectively.

Therefore, when external ambient light is irradiated on the pixel defining layer PDL, the external ambient light will not be reflected by the pixel defining layer PDL, so the color separation phenomenon can be further weakened or even eliminated.

For example, as shown in FIG. 6, the display substrate further includes an encapsulation layer 170 disposed at a side of the light-emitting elements 120 away from the base substrate 111, and the black matrix 135 is disposed at a side of the encapsulation layer 170 away from the base substrate 111. For example, the encapsulation layer 170 can be a composite encapsulation layer, which includes a first inorganic encapsulation layer, a first organic encapsulation layer, and a second inorganic encapsulation layer (not shown in the figure) which are sequentially arranged on the light-emitting elements 120 in order to improve the encapsulation effect.

For example, in some embodiments, color filters used for the plurality of sub-pixels can be disposed in the composite encapsulation layer, for example, between two adjacent sub-encapsulation layers in the composite encapsulation layer. For example, in one example, the composite encapsulation layer includes a first inorganic encapsulation layer, a first organic encapsulation layer, and a second inorganic encapsulation layer which are sequentially arranged on the light-emitting elements 120, and in this case, the color filters can be disposed between the first inorganic encapsulation layer and the second inorganic encapsulation layer.

For example, in some embodiments, as shown in FIG. 6, the display substrate further includes a touch layer FM disposed at a side of the encapsulation layer 170 away from the base substrate 111, and the black matrix 135 is disposed at a side of the touch layer FM away from the base substrate 111.

FIG. 12 shows a schematic plan view of the touch layer FM. As shown in FIG. 6 and FIG. 12, the touch layer FM includes a plurality of touch lines TL, and the orthographic projections of the plurality of touch lines TL on the base substrate 111 do not overlap with the orthographic projections of the plurality of second light-transmitting openings S1 on the base substrate 111. For example, the orthographic projections of the plurality of touch lines TL on the base substrate 111 do not overlap with the orthographic projection of the plurality of color filters 132 on the base substrate 111, either. As a result, the plurality of touch lines TL are shielded by the black matrix 135, so as to avoid light irradiating on the touch lines TL and affecting the signal transmission performance of the touch lines TL. Moreover, the touch lines TL will not shield the second light-transmitting openings S1 and the color filters 132, so as to avoid the influence on the transmission of signal light and light emitted by the light-emitting elements 120.

For example, in some embodiments, in the same direction parallel to the base substrate 111, the plurality of touch lines TL have different distances from at least two of the first filter 132A, the second filter 132B, and the third filter 132C. For example, as shown in FIG. 12, at the position of the dashed frame and in the horizontal direction in the figure, the distance between the touch line TL and the third filter 132C is greater than the distance between the touch line TL and the first filter 132A. Because the shape and arrangement of the third filter 132C are irregular, the distance between the touch line TL and the third filter 132C is set to be large in this direction, which can prevent the touch line TL and the third filter 132C from overlapping in this direction, or avoid the overlapping size of the touch line TL and the third filter 132C is too large.

For example, in some embodiments, as shown in FIG. 12, the first sub-pixels R and the third sub-pixels B are arranged in rows and columns, and first sub-pixels R and third sub-pixels B located in the same column are alternately arranged. For example, at least part of the plurality of touch lines TL have notches NT1/NT2/NT3 between the first sub-pixel R and the third sub-pixel B adjacent to each other and located in the same column. Therefore, it is possible to prevent the touch lines TL from shielding the plurality of first light-transmitting openings 140.

For example, as shown in FIG. 12, at least part of the plurality of touch lines TL have a notch NT1 at a side close to the third sub-pixel B or the first sub-pixel R in the first sub-pixel R and the third sub-pixel B adjacent to each other and located in the same column, and in this case, at least part of the plurality of touch lines TL have one notch between the first sub-pixel R and the third sub-pixel B adjacent to each other and located in the same column. Alternatively, at least part of the plurality of touch lines TL have notches NT2/NT3 at a side close to the third sub-pixel B and at a side close to the first sub-pixel R in the first sub-pixel R and the third sub-pixel B adjacent to each other and located in the same column, and in this case, at least part of the plurality of touch lines TL have two notches between the first sub-pixel R and the third sub-pixel B adjacent to each other and located in the same column. Therefore, it is possible to prevent the touch lines TL from shielding the plurality of first light-transmitting openings 140.

For example, in some embodiments, as shown in FIG. 12, at least part of the plurality of touch lines TL have a notch NT1 at a side close to the third sub-pixel B or at a side close to the first sub-pixel R in the first sub-pixel R and the third sub-pixel B adjacent to each other and located in the $N^{th}$ column, and at least part of the plurality of touch lines TL have notches NT2/NT3 at a side close to the third sub-pixel B and at a side close to the first sub-pixel R in the first sub-pixel R and the third sub-pixel B adjacent to each other and located in the $(N+1)^{th}$ column. In this case, in every two adjacent columns of the first sub-pixels R and the third sub-pixels B, one notch is provided between the first sub-pixel R and the third sub-pixel B adjacent to each other in one column, and two notches are provided between the first sub-pixel R and the third sub-pixel B adjacent to each other in the other column. Therefore, it is possible to prevent the touch lines TL from shielding the plurality of first light-transmitting openings 140.

For example, the display substrate can further include other structures, such as a cover plate, etc. For more details, please refer to the related technologies, which will not be repeated here.

FIG. 13 is a schematic plan view illustrating stacked layers of a spacer layer and a color filter layer in a display substrate provided by an embodiment of the present disclosure. Referring to FIG. 6 and FIG. 13, the display substrate has a plurality of sub-pixels, and the plurality of sub-pixels include a first sub-pixel R, a second sub-pixel G, and a third sub-pixel B; the first sub-pixels R and the third sub-pixels B are alternately arranged in the row direction to form a plurality of first pixel rows, the first sub-pixels R and the third sub-pixels B in the same column among the plurality of first pixel rows are alternately arranged, and the second sub-pixels G are arranged side by side in the row direction to form a plurality of second pixel rows.

Referring to FIG. 6, the display substrate includes a base substrate 111, a pixel driving circuit layer 112, a pixel defining layer PDL, and a black matrix 135, the pixel driving circuit layer 112 is disposed on the base substrate 111, the pixel defining layer PDL is disposed at a side of the pixel driving circuit layer 112 away from the base substrate 111 and includes a plurality of sub-pixel openings 113 for a plurality of sub-pixels, each of the plurality of sub-pixels 130 includes a pixel driving circuit disposed in the pixel driving circuit layer 112 and a light-emitting element 120 at least partially disposed in the sub-pixel opening 113.

For example, FIG. 13 shows a schematic plan view illustrating stacked layers of the black matrix 135 and the spacer layer 190. As shown in FIG. 13, in terms of one first light-transmitting opening 140 and the color filters 132 corresponding to the first sub-pixel R and the third sub-pixel B adjacent to the first light-transmitting opening 140, the connecting line C1 connecting the centers O1 and O2 of the color filters 132 corresponding to the first sub-pixel R and the third sub-pixel B adjacent to the first light-transmitting opening 140 passes through the first light-transmitting opening 140.

For example, as shown in FIG. 13, the distance h1 between the center O3 of the first light-transmitting opening 140 and the center O1 of the color filter 132 corresponding to the first sub-pixel R is different from the distance h2 between the center O3 of the first light-transmitting opening 140 and the center O2 of the color filter 132 corresponding to the third sub-pixel B. For example, h1 is greater than h2, that is, the first light-transmitting opening 140 is closer to the color filter 132 corresponding to the third sub-pixel B than to the color filter 132 corresponding to the first sub-pixel R.

For example, as shown in FIG. 13, the plurality of first light-transmitting openings 140 are also respectively arranged between the color filters 132 corresponding to the adjacent second sub-pixels G in the row direction.

For example, as shown in FIG. 13, in terms of one first light-transmitting opening 140 and the color filters 132 corresponding to the second sub-pixels G adjacent to the first light-transmitting opening 140, the connecting line C2 connecting the centers O4 and O5 of the color filters 132 corresponding to the adjacent second sub-pixels G passes through the first light-transmitting opening 140. For example, as shown in FIG. 13, the distances h3 and h4 between the center O6 of the first light-transmitting opening 140 and the centers O4 and O5 of the color filter 132 corresponding to the adjacent second sub-pixel G are basically the same.

For example, referring to FIG. 6 and FIG. 9, the plurality of color filters 132 include a first filter 132A, a second filter 132B, and a third filter 132C.

The orthographic projection of the sub-pixel opening 113 of the first sub-pixel R on the base substrate 111 is located within the orthographic projection of the first filter 132A on the base substrate 111, so that the light emitted by the light-emitting element of the first sub-pixel R can exit through the first filter 132A. The orthographic projection of the sub-pixel opening 113 of the second sub-pixel G on the base substrate 111 is located within the orthographic projection of the second filter 132B on the base substrate 111, so that the light emitted by the light-emitting element of the second sub-pixel G can exit through the second filter 132B. The orthographic projection of the sub-pixel opening 113 of the third sub-pixel B on the base substrate 111 is located within the orthographic projection of the third filter 132C on the base substrate 111, so that the light emitted by the light-emitting element of the third sub-pixel B can exit through the third filter 132C.

For example, referring to FIG. 9, in terms of the sub-pixel opening 113 and the third filter 132C corresponding to the third sub-pixel B, the distance b+d between the boundary of the orthographic projection of the sub-pixel opening 113 on the base substrate 111 and the boundary of the orthographic projection of the third filter 132C on the base substrate 111 at the side close to the first light-transmitting opening 140 is less than the distance b1+e between the boundary of the orthographic projection of the sub-pixel opening 113 on the base substrate 111 and the boundary of the orthographic projection of the third filter 132C on the base substrate 111 at the side away from the first light-transmitting opening 140. In terms of other arrangement relationships among the sub-pixel opening 113, the color filter 132, the first light-transmitting opening 140, and the third filter 132C, reference can be made to the above embodiments.

For example, the first sub-pixel R is a red sub-pixel, the second sub-pixel G is a green sub-pixel, and the third sub-pixel B is a blue sub-pixel.

For example, referring to FIG. 6 and FIG. 8, the display substrate further includes a light-shielding layer S, the light-shielding layer S is disposed between the base substrate 111 and the pixel driving circuit layer 112 and includes a plurality of second light-transmitting openings S1, and the orthographic projections of at least part of the second light-transmitting openings S1 on the base substrate 111 are respectively located within the orthographic projections of the plurality of first light-transmitting openings 140 on the base substrate 111.

For example, one first sub-pixel R, two second sub-pixels G, and one third sub-pixel B form a repeating unit, a plurality of repeating units are arranged in an array, and each of the repeating units is correspondingly provided with two second light-transmitting openings S1. For example, every second light-transmitting opening S1 is correspondingly provided with one first light-transmitting opening 140, or in some other embodiments, every two or more second light-transmitting openings S1 are correspondingly provided with one first light-transmitting opening 140. For more details, please refer to the above-mentioned embodiments, which will not be repeated here.

For example, the display substrate can further include other structures, such as a spacer layer, an encapsulation layer, a touch layer, etc. For more details, please refer to the above embodiments, which will not be repeated here.

For example, in various embodiments of the present disclosure, the pixel driving circuit can have a 3T1C, 4T1C, 5T1C, 5T2C, 6T1C, 7T1C or 8T1C structure.

FIG. 14 is an equivalent circuit diagram of an 8T1C pixel driving circuit. As shown in FIG. 14, the pixel driving circuit can include eight transistors (first to eighth transistors T1-T8), one storage capacitor C, and a plurality of signal lines (e.g., a data signal line Data, a first scan signal line Gate, a second scan signal line GateN, a reset control signal line Reset, a first initial signal line INIT1, a second initial signal line INIT2, a first power line VDD, a second power line VSS, a light-emitting control signal line EM, etc.).

For example, the gate electrode of the first transistor T1 is connected to the reset control signal line Reset, the first electrode of the first transistor T1 is connected to the second initial signal line INIT2, and the second electrode of the first transistor T1 is connected to a fifth node N5. The gate electrode of the second transistor T2 is connected to the first scan signal line Gate, the first electrode of the second transistor T2 is connected to the fifth node N5, and the second electrode of the second transistor T2 is connected to a third node N3. The gate electrode of the third transistor T3 is connected to the first node N1, the first electrode of the third transistor T3 is connected to a second node N2, and the second electrode of the third transistor T3 is connected to the third node N3. The gate electrode of the fourth transistor T4 is connected to the first scan signal line Gate, the first electrode of the fourth transistor T4 is connected to the data signal line Data, and the second electrode of the fourth transistor T4 is connected to the second node N2. The gate electrode of the fifth transistor T5 is connected to the light-emitting control signal line EM, the first electrode of the fifth transistor T5 is connected to the first power line VDD, and the second electrode of the fifth transistor T5 is connected to the second node N2. The gate electrode of the sixth transistor T6 is connected to the light-emitting control signal line EM, the first electrode of the sixth transistor T6 is connected to the third node N3, and the second electrode of the sixth transistor T6 is connected to a fourth node N4 (that is, the first electrode of the light-emitting element). The gate electrode of the seventh transistor T7 is connected to the first scan signal line Gate or the reset control signal line Reset, the first electrode of the seventh transistor T7 is connected to the first initial signal line INIT1, and the second electrode of the seventh transistor T7 is connected to the fourth node N4. The gate electrode of the eighth transistor T8 is connected to the second scan signal line GateN, the first electrode of the eighth transistor T8 is connected to the fifth node N5, and the second electrode of the eighth transistor T8 is connected to the first node N1. The first terminal of the storage capacitor C is connected to the first power line VDD, and the second terminal of the storage capacitor C is connected to the first node N1.

In some embodiments, the first to seventh transistors T1-T7 can be N-type thin film transistors, and the eighth transistor T8 can be a P-type thin film transistor; alternatively, the first to seventh transistors T1-T7 can be P-type thin film transistors, and the eighth transistor T8 can be an N-type thin film transistor.

In some embodiments, the first to seventh transistors T1-T7 can be low temperature poly silicon (LTPS) thin film transistors (TFT), and the eighth transistor T8 can be an indium gallium zinc oxide (IGZO) thin film transistor.

In the above embodiments, compared with the low temperature poly silicon thin film transistor, the indium gallium zinc oxide thin-film transistor generates less leakage current. Therefore, by setting the eighth transistor T8 as the indium gallium zinc oxide thin film transistor, the generation of leakage current can be significantly reduced, thus alleviating the problem of low-frequency and low-brightness flicker of the display panel. In addition, the first transistor T1 and the second transistor T2 do not need to be set as indium gallium zinc oxide thin film transistors. Because the size of the low temperature poly silicon thin film transistor is generally smaller than the size of the indium gallium zinc oxide thin film transistor, the occupied space of the pixel driving circuit in the embodiments of the present disclosure will be relatively small, which is helpful to improve the resolution of the display panel.

The pixel driving circuit provided by the embodiments of the present disclosure integrates the good switching characteristics of LTPS-TFT and the low leakage characteristics of Oxide-TFT, and can realize low-frequency (1 Hz-60 Hz) driving and greatly reduce the power consumption of the display screen.

In some embodiments, the second electrode of the light-emitting element is connected to the second power line VSS, and the signal of the second power line VSS is a continuous low-level signal, and the signal of the first power line VDD is a continuous high-level signal. The signal of the first scan signal line Gate is a scan signal in the pixel driving circuits of the present display row, and the signal of the reset control signal line Reset is a scan signal in the pixel driving circuits of the previous display row. That is, for the n$^{th}$ display row, the first scan signal line Gate is Gate(n), the reset control signal line Reset is Gate(n-1), and the signal of the reset control signal line Reset of the present display row and the signal of the first scan signal line Gate in the pixel driving circuits of the previous display row can be the same signal, so as to reduce the number of signal lines of the display panel and realize a narrow frame of the display panel.

In some embodiments, the first scan signal line Gate, the second scan signal line GateN, the reset control signal line Reset, the light-emitting control signal line EM, the first initial signal line INIT1, and the second initial signal line INIT2 all extend along a horizontal direction, and the second power line VSS, the first power line VDD and the data signal line Data all extend along a vertical direction.

In some embodiments, at least part of the first initial signal line INIT1, the second initial signal line INIT2, the second power line VSS, and the first power line VDD can have a mesh structure, that is, they include both horizontally extending portions and vertically extending portions.

FIG. 15 is an operation timing chart of a pixel driving circuit. Hereinafter, an exemplary embodiment of the present disclosure will be described through the operation process of the pixel driving circuit shown in FIG. 14. The pixel driving circuit in FIG. 14 includes eight transistors (the first to eighth transistors T1-T8) and a storage capacitor C. The present embodiment is described by taking that the first to seventh transistors T1-T7 are P-type transistors, the eighth transistor T8 is an N-type transistor, and the gate electrode of the seventh transistor T7 is connected to the first scan signal line Gate as an example.

For example, in some embodiments, the operation process of the pixel driving circuit can include the following stages.

In a first stage t1, which is also called a reset stage, the signals of the first scan signal line Gate, the reset control signal line Reset, the second scan signal line GateN, and the light-emitting control signal line EM are all high-level signals, and the signal of the reset control signal line Reset is a low-level signal. The high-level signal of the light-emitting control signal line EM turns off the fifth transistor T5 and the sixth transistor T6, the high-level signal of the second scan signal line GateN turns on the eighth transistor T8, and the low-level signal of the reset control signal line Reset turns on the first transistor T1. Therefore, the voltage of the first node N1 is reset to a second initial voltage Vinit2 provided by the second initial signal line INIT2, and then the potential of the reset control signal line Reset is set to be at a high level, and the first transistor T1 is turned off. Because the fifth transistor T5 and the sixth transistor T6 are turned off, the light-emitting element EL does not emit light in this stage.

In a second stage t2, which is also called a data writing stage, the signal of the first scan signal line Gate is a low-level signal, the fourth transistor T4, the second transistor T2, and the seventh transistor T7 are turned on, the data signal line Data outputs a data voltage, and the voltage of the fourth node N4 is reset to a first initial voltage Vinit1 provided by the first initial voltage line INIT1, thus completing initialization. In this stage, because the first node N1 is at a low level, the third transistor T3 is turned on. The fourth transistor T4 and the second transistor T2 are turned on, so that the data voltage output by the data signal line Data is provided to the first node N1 through the turned-on fourth transistor T4, the second node N2, the turned-on third transistor T3, the third node N3, the turned-on second transistor T2, the fifth node N5, and the eighth transistor T8; and the sum of the data voltage output by the data signal line Data and the threshold voltage of the third transistor T3 is charged into the storage capacitor C, the voltage of the second terminal (first node N1) of the storage capacitor C is Vdata+Vth, where Vdata is the data voltage output by the data signal line Data, and Vth is the threshold voltage of the third transistor T3. The signal of the light-emitting control signal line EM is a high-level signal, and the fifth transistor T5 and the sixth transistor T6 are turned off to ensure that the light-emitting element EL does not emit light.

In a third stage t3, which is also called a light-emitting stage, the signals of the first scan signal line Gate and the reset control signal line Reset are high-level signals, and the signals of the light-emitting control signal line EM and the second scan signal line GateN are low-level signals. The high-level signal of the reset control signal line Reset turns off the seventh transistor T7, the low-level signal of the light-emitting control signal line EM turns on the fifth transistor T5 and the sixth transistor T6, and the power voltage output by the first power line VDD provides a driving voltage to the first electrode (that is, the fourth node N4) of the light-emitting element EL through the turned-on fifth transistor T5, the turned-on third transistor T3 and the turned-on sixth transistor T6, so as to drive the light-emitting element EL to emit light.

In the driving process of the pixel driving circuit, the driving current flowing through the third transistor T3 is determined by the voltage difference between the gate electrode and the first electrode thereof. Because the voltage of the first node N1 is Vdata+Vth, the driving current of the third transistor T3 is:

$$I=K^*(Vgs-Vth)^2=K^*[(Vdata+Vth-Vdd)-Vth]^2=K^*[(Vdata-Vdd)]^2,$$

where I is the driving current flowing through the third transistor T3, that is, the driving current for driving the light-emitting element EL; K is a constant, Vgs is the voltage difference between the gate electrode and the first electrode of the third transistor T3, Vth is the threshold voltage of the third transistor T3, Vdata is the data voltage output by the data signal line Data, and Vdd is the power voltage output by the first power terminal VDD.

It can be seen from the above formula that the current I flowing through the light-emitting element EL has nothing to do with the threshold voltage Vth of the third transistor T3, which eliminates the influence of the threshold voltage Vth of the third transistor T3 on the current I and ensures the uniformity of brightness.

Based on the above operation sequence, the pixel driving circuit eliminates the residual positive charge of the light-emitting element EL after a previous light emission, realizes the compensation of voltage on the gate electrode of the third transistor, avoids the influence of the threshold voltage drift of the third transistor on the driving current of the light-emitting element EL, and improves the uniformity of the displayed image and the display quality of the display panel.

In the pixel driving circuit of the embodiment of the present disclosure, the fourth node N4 is initialized as the signal of the first initial signal line INIT1, and the fifth node N5 is initialized as the signal of the second initial signal line INIT2, so that the reset voltage of the light-emitting element EL and the reset voltage of the first node N1 can be adjusted respectively, thereby achieving a better display effect and alleviating problems such as low-frequency flicker, etc.

FIG. 16-FIG. 27 are schematic plan views of various layers sequentially stacked in a display substrate provided by at least one embodiment of the present disclosure.

Figure 16:
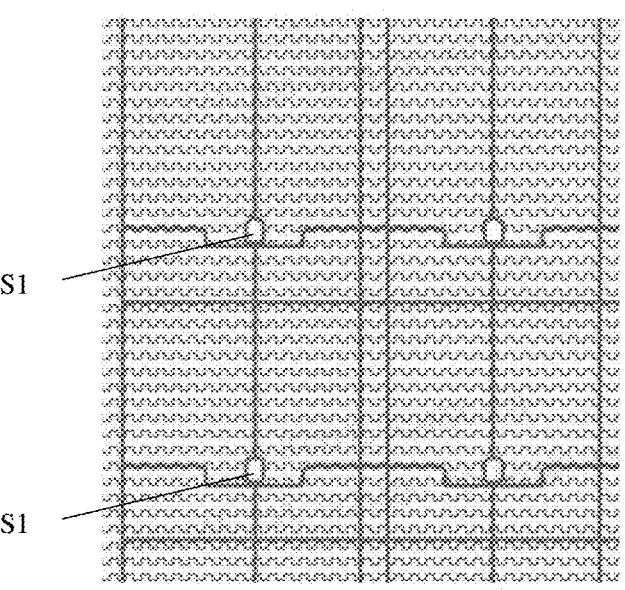

For example, FIG. 16 shows a schematic plan view of a light-shielding layer, and the light-shielding layer includes a plurality of second light-transmitting openings S1.

Figure 17:
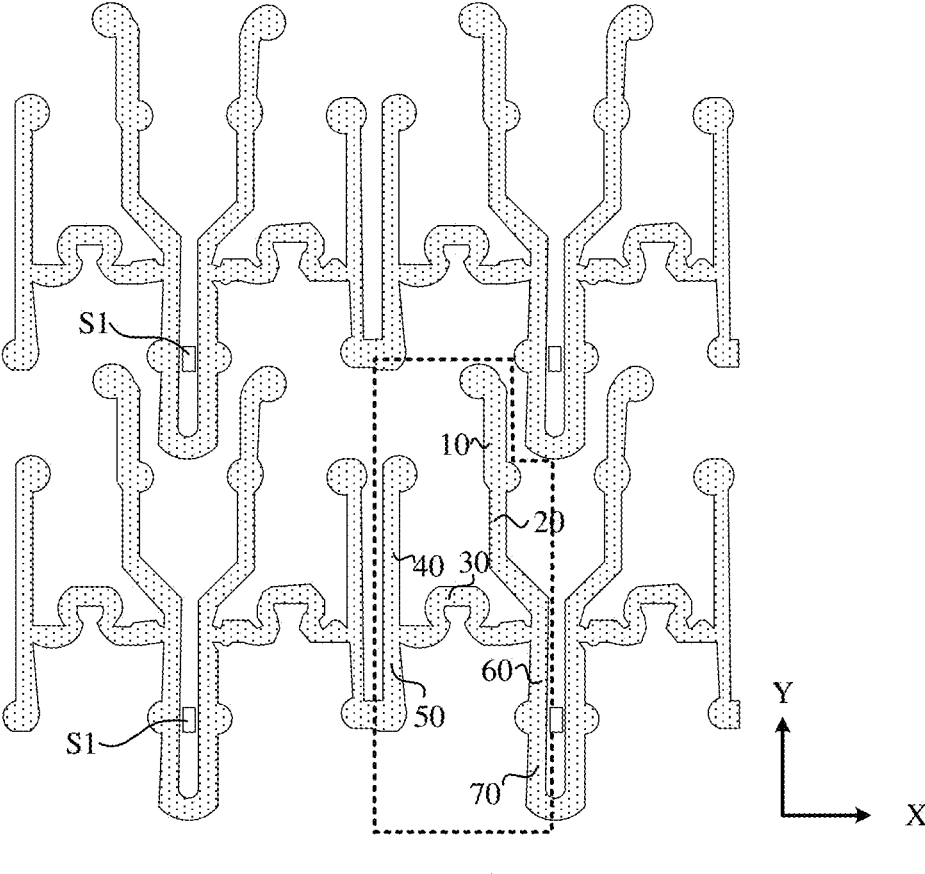

FIG. 17 shows a schematic plan view of a first semiconductor layer stacked on the light-shielding layer, and the first semiconductor layer includes active layers of a plurality of thin film transistors. The first semiconductor layer can be made of silicon material, and the silicon material includes amorphous silicon or poly-silicon; in some embodiments, the first semiconductor layer can be made of amorphous silicon a-Si, which can be formed into poly-silicon by means of crystallization or laser annealing, etc.

The range shown by the dashed frame in FIG. 17 is the setting range of the pixel driving circuit of one sub-pixel. As shown in FIG. 17, the first semiconductor layer can include a first active layer 10 of a first transistor T1, a second active layer 20 of a second transistor T2, a third active layer 30 of a third transistor T3, a fourth active layer 40 of a fourth transistor T4, a fifth active layer 50 of a fifth transistor T5, a sixth active layer 60 of a sixth transistor T6 and a seventh active layer 70 of a seventh transistor T7. The first active layer 10, the second active layer 20, the third active layer 30, the fourth active layer 40, the fifth active layer 50, the sixth active layer 60, and the seventh active layer 70 are interconnected into an integrated structure.

In some embodiments, the shape of the third active layer 30 can be in a shape of 7, and the shapes of the first active layer 10, the second active layer 20, the fourth active layer 40, the fifth active layer 50, the sixth active layer 60, and the seventh active layer 70 can be 1-shaped.

In some embodiments, in the second direction Y, the first semiconductor layers of any two adjacent columns of sub-pixels are mirror symmetric structures.

In some embodiments, the channel region of the third active layer 30 extends along the row direction, and the channel regions of the first active layer 10, the second active layer 20, the fourth active layer 40, the fifth active layer 50, the sixth active layer 60, and the seventh active layer 70 extend along the column direction.

For example, the orthographic projection of the second light-transmitting opening S1 on the base substrate 111 is adjacent to the orthographic projections of the sixth active layer 60 and the seventh active layer 70 on the base substrate 111, and correspondingly, the orthographic projection of the first light-transmitting opening 140 on the base substrate 111 is adjacent to the orthographic projections of the sixth active layer 60 and the seventh active layer 70 on the base substrate 111.

In some embodiments, the first semiconductor layer can adopt poly-silicon (p-Si), that is, the first transistor, the second transistor, the third transistor, the fourth transistor, the fifth transistor, the sixth transistor, and the seventh transistor can all be LTPS thin film transistors.

Figure 18:
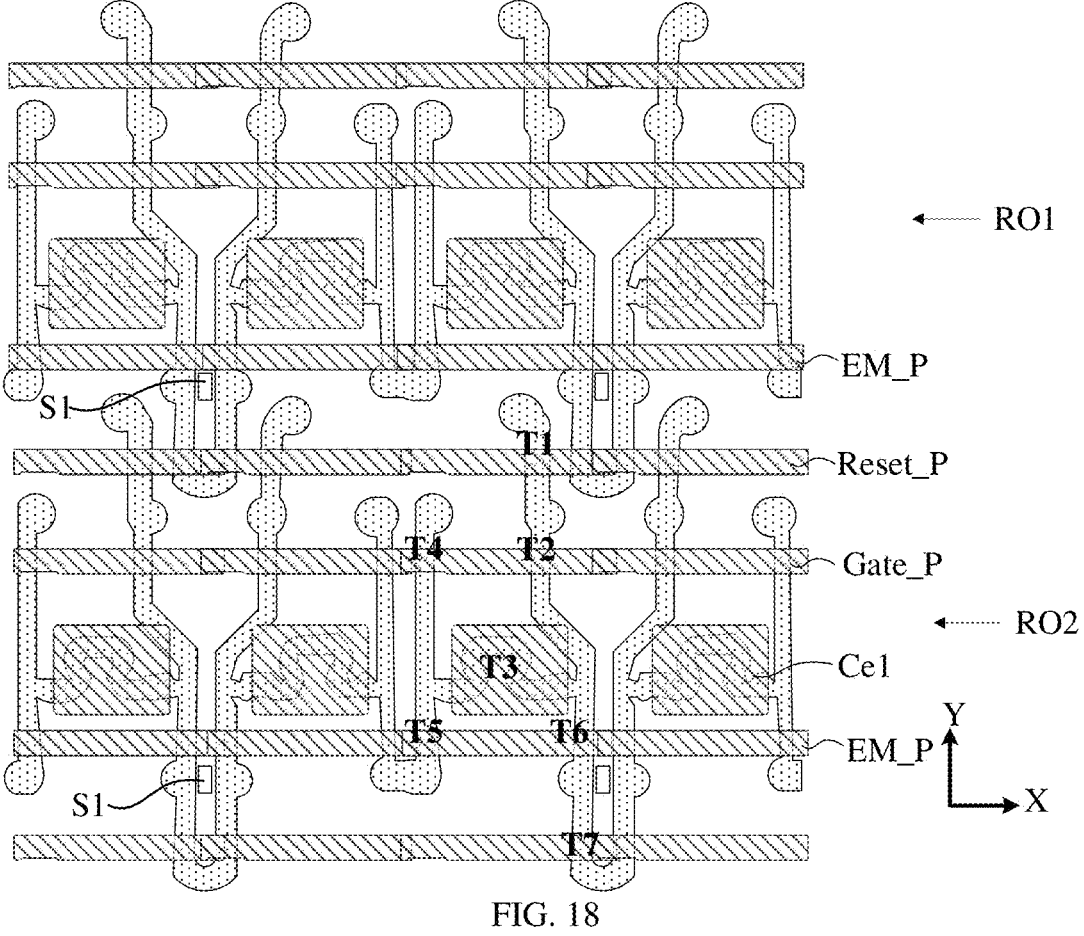

For example, FIG. 18 shows a schematic plan view of a first conductive layer stacked on the first semiconductor layer. In some embodiments, as shown in FIG. 18, the first conductive layer can include a first scan signal line Gate_P, a reset control signal line Reset_P, a light-emitting control signal line EM_P, and a first electrode plate Ce1 of a storage capacitor C. In some embodiments, the first conductive layer can be referred to as a first gate metal (GATE1) layer.

In some embodiments, in the second direction Y, the first conductive layers of any two adjacent columns of sub-pixels are mirror symmetric structures.

In some embodiments, the first scan signal line Gate_P, the reset control signal line Reset_P, and the light-emitting control signal line EM_P all extend along the first direction X. In each sub-pixel, the reset control signal line Reset_P is located at a side of the first scan signal line Gate_P away from the light-emitting control signal line EM_P, and the first electrode plate Ce1 of the storage capacitor is disposed between the first scan signal line Gate_P and the light-emitting control signal line EM_P.

For example, the pixel driving circuit layer (e.g., the first conductive layer) includes a first signal line (e.g., a light-emitting control signal line EM_P in some embodiments) and a second signal line (e.g., a reset control line Reset_P in some embodiments) which are arranged in parallel with each other and periodically, and the first signal line and the second signal line are configured to provide different electrical signals to the plurality of sub-pixels. The orthographic projections of the plurality of second light-transmitting openings S1 on the base substrate 111 are located between the orthographic projection of one first signal line e.g., a light-emitting control signal line EM_P) on the base substrate 111 and the orthographic projection of one second signal line (e.g., a reset control line Reset_P) closest to the first signal line on the base substrate 111. Accordingly, the orthographic projections of the plurality of first light-transmitting openings 140 on the base substrate 111 are located between the orthographic projection of one first signal line e.g., a light-emitting control signal line EM_P) on the base substrate 111 and the orthographic projection of one second signal line (e.g., a reset control line Reset_P) closest to the first signal line on the base substrate 111.

For example, a plurality of sub-pixels include a first row of sub-pixels RO1 and a second row of sub-pixels RO2 adjacent to and at a next stage relative to the first row of sub-pixels RO1, the pixel driving circuits of the first row of sub-pixels RO1 share one light-emitting control signal line EM_P and one reset control line Reset_P, the pixel driving circuits of the second row of sub-pixels RO2 share one light-emitting control signal line EM_P and one reset control line Reset_P, and the orthographic projections of one row of second light-transmitting opening S1 on the base substrate 111 are included between the orthographic projection of the light-emitting control signal line EM_P shared by the pixel driving circuits of the first row of sub-pixels RO1 on the base substrate 111 and the orthographic projection of the reset control line Reset_P shared by the pixel driving circuits of the second row of sub-pixels RO2 on the base substrate 111. Accordingly, the orthographic projections of one row of first light-transmitting openings 140 on the base substrate 111 are included between the orthographic projection of the light-emitting control signal line EM_P shared by the pixel driving circuits of the first row of sub-pixels RO1 on the base substrate 111 and the orthographic projection of the reset control line Reset_P shared by the pixel driving circuits of the second row of sub-pixels RO2 on the base substrate 111.

In some embodiments, the first electrode plate Ce1 can have a rectangular shape, the corners of the rectangular shape can be rounded, and the orthographic projection of the first electrode plate Ce1 on the base substrate 111 and the orthographic projection of the third active layer 30 of the third transistor T3 on the base substrate 111 have an overlapping region. In some embodiments, the first plate electrode Ce1 also serves as the gate electrode of the third transistor T3.

In some embodiments, a region of the reset control signal line Reset_P overlapping with the first active layer of the first transistor T1 serves as the gate electrode of the first transistor T1, a region of the first scan signal line Gate_P overlapping with the second active layer of the second transistor T2 serves as the gate electrode of the second transistor T2, a region of the first scan signal line Gate_P overlapping with the fourth active layer of the fourth transistor T4 serves as the gate electrode of the fourth transistor T4, a region of the light-emitting control signal line EM_P overlapping with the fifth active layer of the fifth transistor T5 serves as the gate electrode of the fifth transistor T5, and a region of the light-emitting control signal line EM_P overlapping with the sixth active layer of the sixth transistor T6 serves as the gate electrode of the sixth transistor T6. A region, overlapping with the seventh active layer of the seventh transistor T7 in the present row of sub-pixels, of the reset control signal line Reset_P (having the same signal as the first scan signal line Gate_P in the present row of sub-pixels) in the next row of sub-pixel relative to each row of sub-pixels, serves as the gate electrode of the seventh transistor T7.

Figure 19:
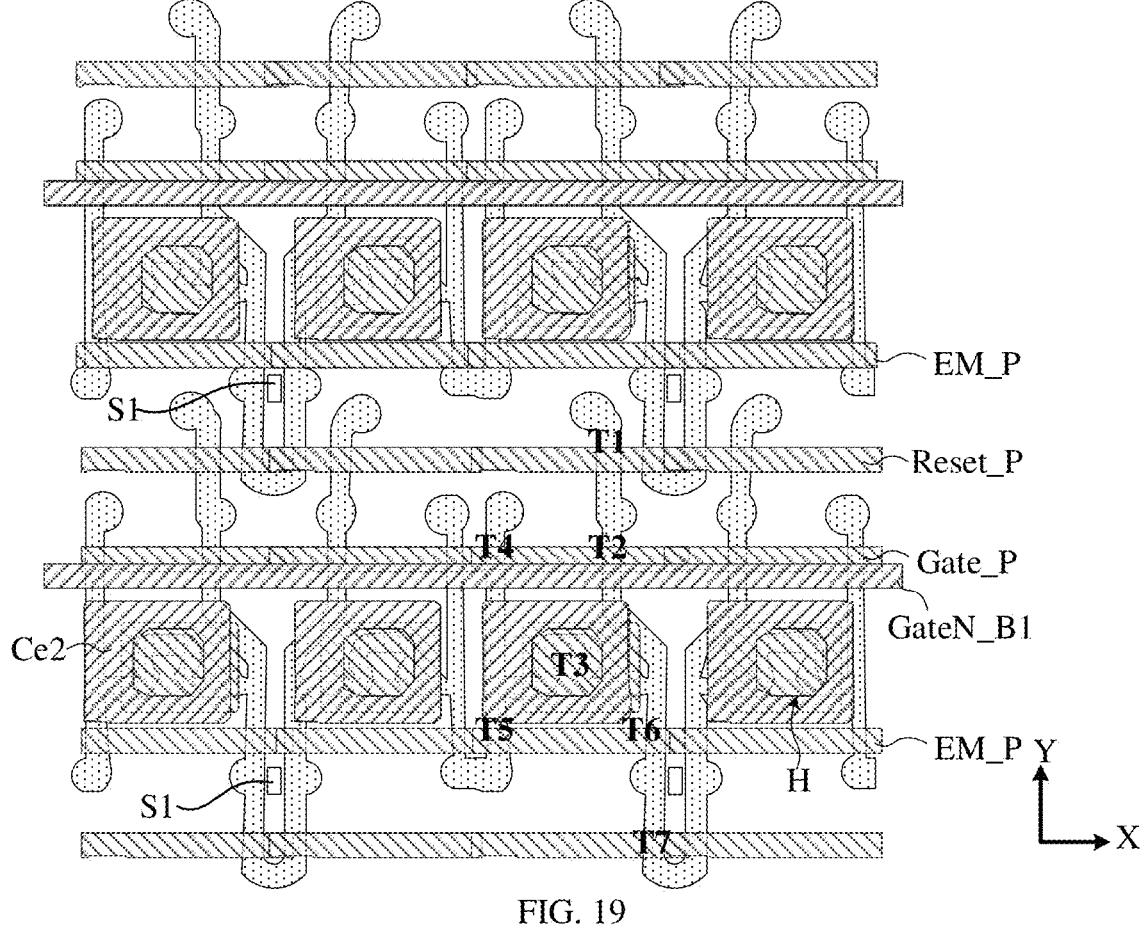

For example, FIG. 19 shows a schematic plan view of a second conductive layer stacked on the first conductive layer. As shown in FIG. 19, the second conductive layer includes a second electrode plate Ce2 of a storage capacitor C and a first branch GateN_B1 of the second scan signal line GateN. In some embodiments, the second conductive layer can be referred to as a second gate metal (GATE 2) layer.

In some embodiments, in the second direction Y, the second conductive layers of any two adjacent columns of sub-pixels are mirror symmetric structures.

In some embodiments, the first branch GateN_B1 of the second scan signal line GateN extends along the first direction X. In each sub-pixel, the second electrode plate Ce2 of the storage capacitor is located between the first branch GateN_B1 of the second scan signal line GateN and the light-emitting control signal line EM_P.

In some embodiments, the outline of the second electrode plate Ce2 can have a rectangular shape, the corners of the rectangular shape can be rounded, and the orthographic projection of the second electrode plate Ce2 on the base substrate 111 and the orthographic projection of the first electrode plate Ce1 on the base substrate 111 have an overlapping region. The second electrode plate Ce2 is provided with an opening H, and the opening H can be located in the middle of the second electrode plate Ce2. The opening H can have a regular hexagonal shape, so that the second electrode plate Ce2 is formed as an annular structure. The opening H exposes a third insulating layer covering the first electrode plate Ce1, and the orthographic projection of the first electrode plate Ce1 on the base substrate 111 includes the orthographic projection of the opening H on the base substrate 111. In some embodiments, the opening H is configured to accommodate a fourth via hole subsequently formed, and the fourth via hole is located in the opening H and exposes the first electrode plate Ce1, so that the second electrode of the eighth transistor T8 subsequently formed is connected to the first electrode plate Ce1.

Figure 20:
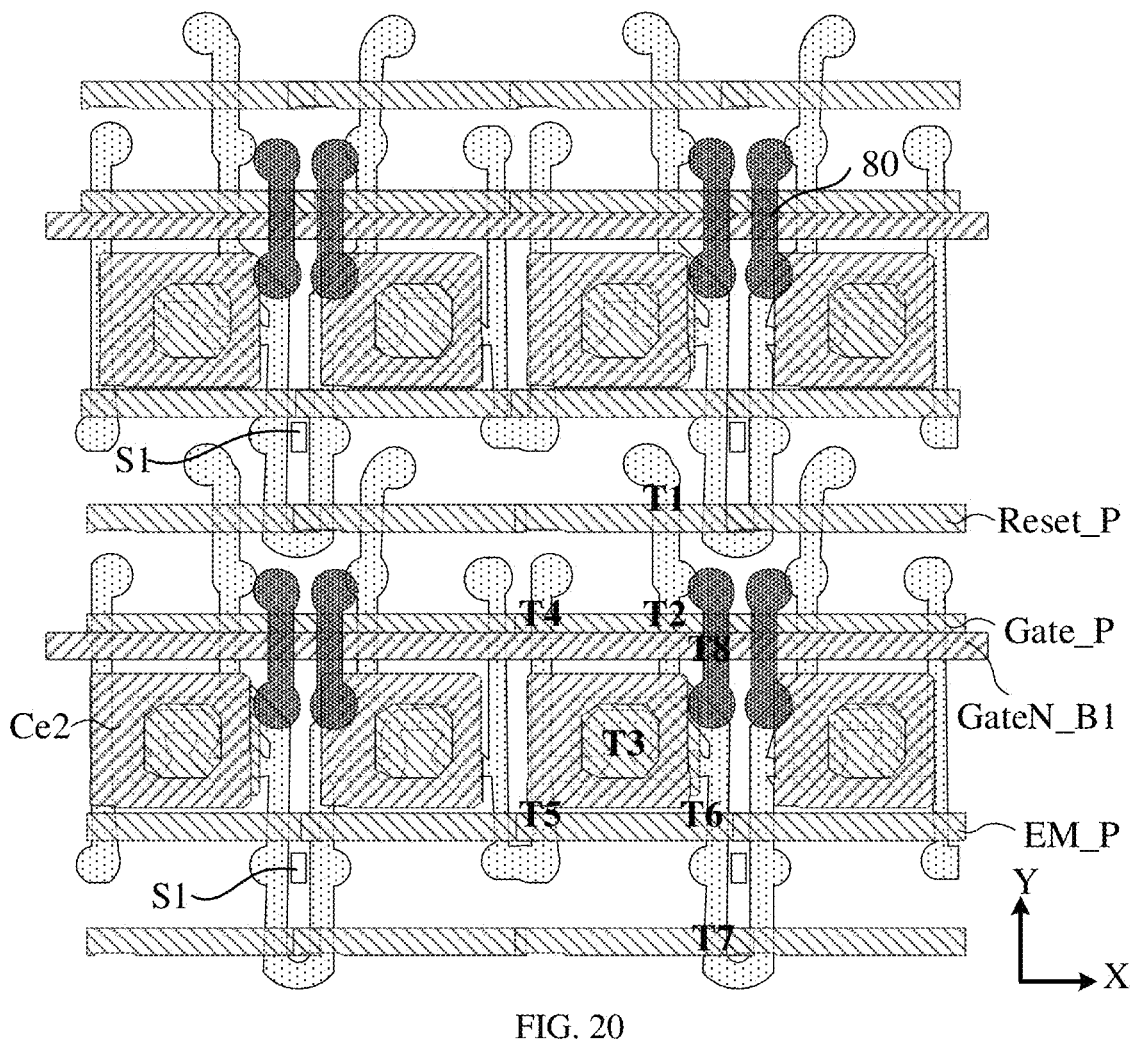

For example, FIG. 20 shows a schematic plan view of a second semiconductor layer stacked on the second conductive layer. In some embodiments, as shown in FIG. 20, the second semiconductor layer of each sub-pixel can include an eighth active layer 80 of the eighth transistor T8. In some embodiments, the eighth active layer 80 extends along the second direction Y, and the shape of the eighth active layer 80 can be dumbbell-shaped.

In the second direction Y, the second semiconductor layers of any two adjacent columns of sub-pixels are mirror symmetric structures.

In some embodiments, the second semiconductor layer can be made of oxide, that is, the eighth transistor is an oxide thin film transistor.

Figure 21:
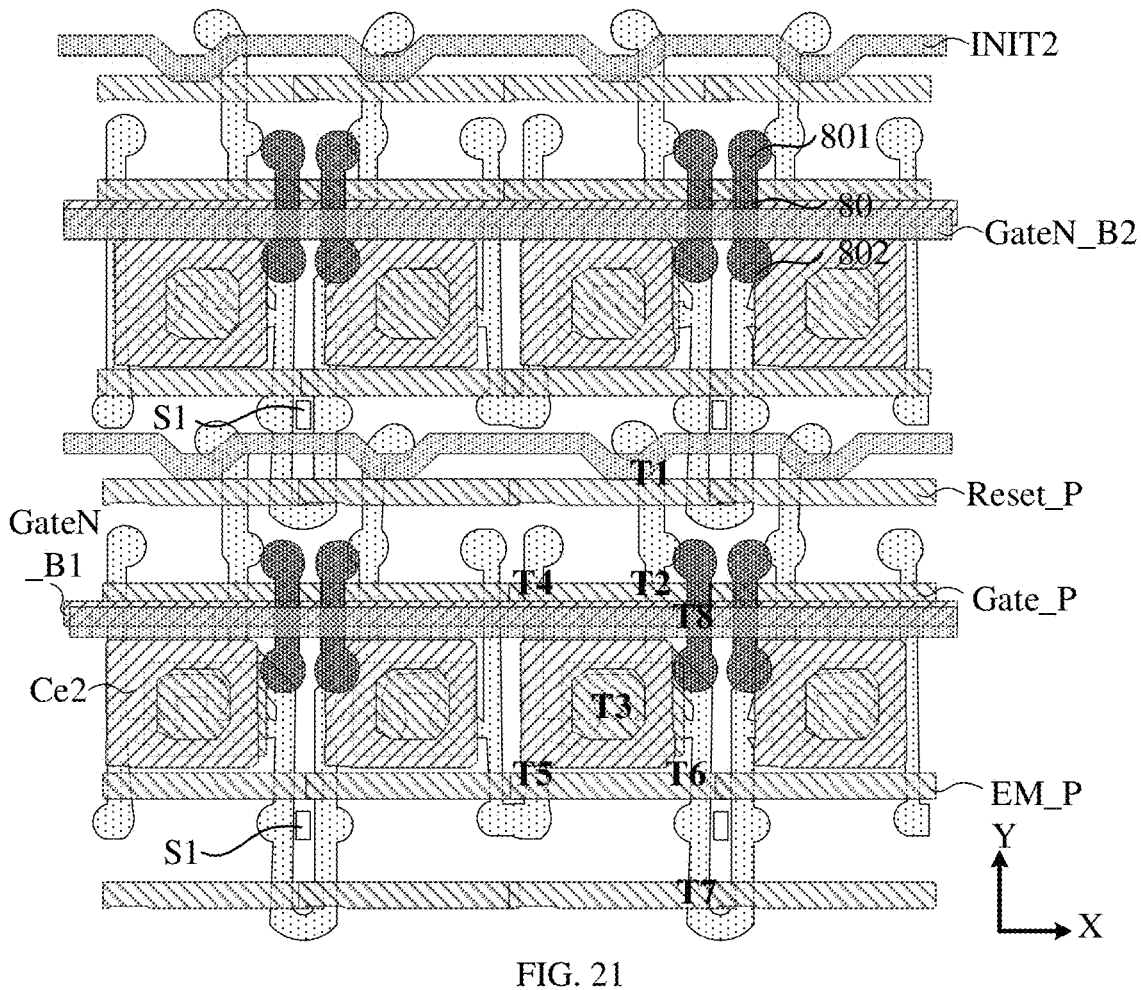

For example, FIG. 21 shows a schematic plan view of a third conductive layer stacked on the second conductive layer. As shown in FIG. 21, the third conductive layer includes a second branch GateN_B2 of the second scan signal line GateN and a second initial signal line INIT2. In some embodiments, the third conductive layer can be referred to as a third gate metal (GATE3) layer.

In some embodiments, in the second direction Y, the third conductive layers of any two adjacent columns of sub-pixels are mirror symmetric structures.

In some embodiments, the second branch GateN_B2 of the second scan signal line GateN extends along the first direction X, and the second branch GateN_B2 of the second scan signal line GateN is close to the second branch Gate_B2 of the first scan signal line Gate. In some embodiments, a region of the second branch GateN_B2 of the second scan signal line GateN overlapping with the eighth active layer 80 serves as the gate electrode of the eighth transistor.

In some embodiments, the orthographic projection of the second branch GateN_B2 of the second scan signal line on the base substrate 111 overlaps with the orthographic projection of the first branch GateN_B1 of the second scan signal line on the base substrate 111. In some embodiments, the first branch GateN_B1 of the second scan signal line and the second branch GateN_B2 of the second scan signal line can be connected by a signal line in the peripheral region.

In some embodiments, the second initial signal line INIT2 extends along the first direction X, and in each row of sub-pixels, the second initial signal line INIT2 is disposed at a side of the reset control signal line Reset_P away from the first scan signal line Gate_P.

For example, the orthographic projection of the second light-transmitting opening S1 on the base substrate 111 is also located between the orthographic projection of a light-emitting control signal line EM_P and the orthographic projection of a second initial signal line INIT2 closest to the light-emitting control signal line EM_P on the base substrate 111. Correspondingly, the orthographic projection of the first light-transmitting opening 140 on the base substrate 111 is also located between the orthographic projection of a light-emitting control signal line EM_P and the orthographic projection of a second initial signal line INIT2 closest to the light-emitting control signal line EM_P on the base substrate 111.

Figure 22:
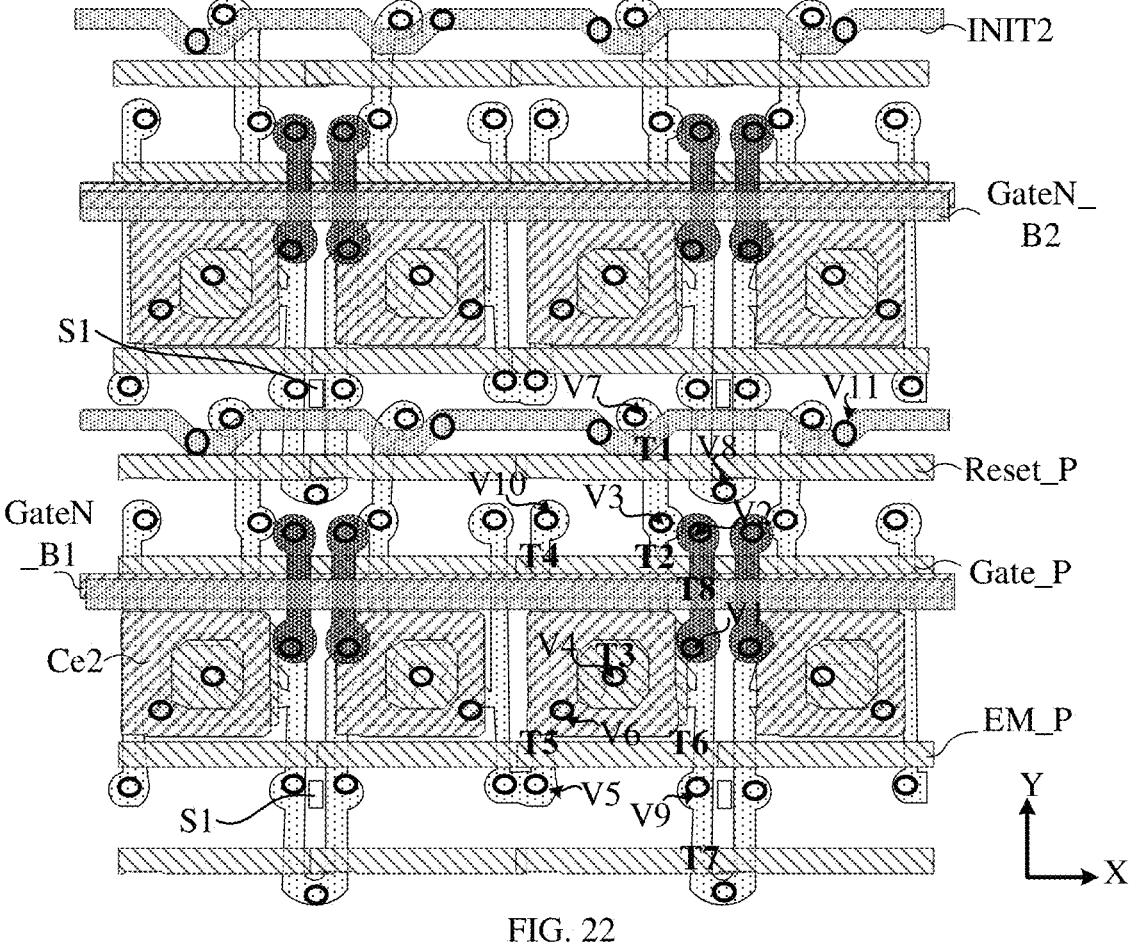

For example, FIG. 22 shows a planar distribution view of a plurality of via holes in an insulating layer formed on the third conductive layer. As shown in FIG. 22, the plurality of via holes are disposed in the insulating layer, and the plurality of via holes include a first via hole V1, a second via hole V2, a third via hole V3, a fourth via hole V4, a fifth via hole V5, a sixth via hole V6, a seventh via hole V7, an eighth via hole V8, a ninth via hole V9, a tenth via hole V10, and an eleventh via hole V11.

For example, the first via hole V1 exposes the surface of a second region of the eighth active layer 80. The second via hole exposes the surface of a first region of the eighth active layer 80. The third via hole V3 exposes the surface of a first region of the second active layer. The third via hole V3 is configured such that the first electrode of the second transistor T2 subsequently formed is connected to the second active layer through this via hole.

The fourth via hole V4 is located in the opening H of the second electrode plate Ce2, the orthographic projection of the fourth via hole V4 on the base substrate 111 is within the range of the orthographic projection of the opening H on the base substrate 111, and the fourth via hole V4 exposes the surface of the first electrode plate Ce1. The fourth via hole V4 is configured such that a third connection electrode 43 subsequently formed is connected to the first electrode plate Ce1 through this via hole.

The fifth via hole V5 exposes the surface of a first region of the fifth active layer. The fifth via hole V5 is configured such that the first electrode of the fifth transistor T5 subsequently formed is connected to the fifth active layer through this via hole.

The sixth via hole V6 is located in the region where the second electrode plate Ce2 is located, and the orthographic projection of the sixth via hole V6 on the base substrate 111 is within the range of the orthographic projection of the second electrode plate Ce2 on the base substrate 111. Parts of the sixth insulating layer, the fifth insulating layer, and the fourth insulating layer in the sixth via hole V6 are etched away, thus exposing the surface of the second electrode plate Ce2. The sixth via hole V6 is configured such that a fifth connection electrode 45 subsequently formed is connected to the second electrode plate Ce2 through this via hole.

The seventh via hole V7 exposes the surface of a first region of the first active layer. The seventh via hole V7 is configured such that the first electrode of the first transistor T1 subsequently formed is connected to the first active layer through this via hole. The eighth via hole V8 exposes the surface of a first region of the seventh active layer. The eighth via hole V8 is configured such that the first initial signal line subsequently formed is connected to the seventh active layer through this via hole. The ninth via hole V9 exposes the surface of a second region of the sixth active layer. The ninth via hole V9 is configured such that the second electrode of the sixth transistor T6 subsequently formed is connected to the sixth active layer through this via hole, and the second electrode of the seventh transistor T7 subsequently formed is connected to the seventh active layer through this via hole.

The tenth via hole V10 exposes the surface of a first region of the fourth active layer. The tenth via hole V10 is configured such that a second connection electrode 42 subsequently formed is connected to the fourth active layer through this via hole. The eleventh via hole V11 exposes the surface of the second initial signal line INIT2. The eleventh via hole V11 is configured such that a sixth connection electrode 46 subsequently formed is connected to the second initial signal line INIT2 through this via hole.

Figure 23:
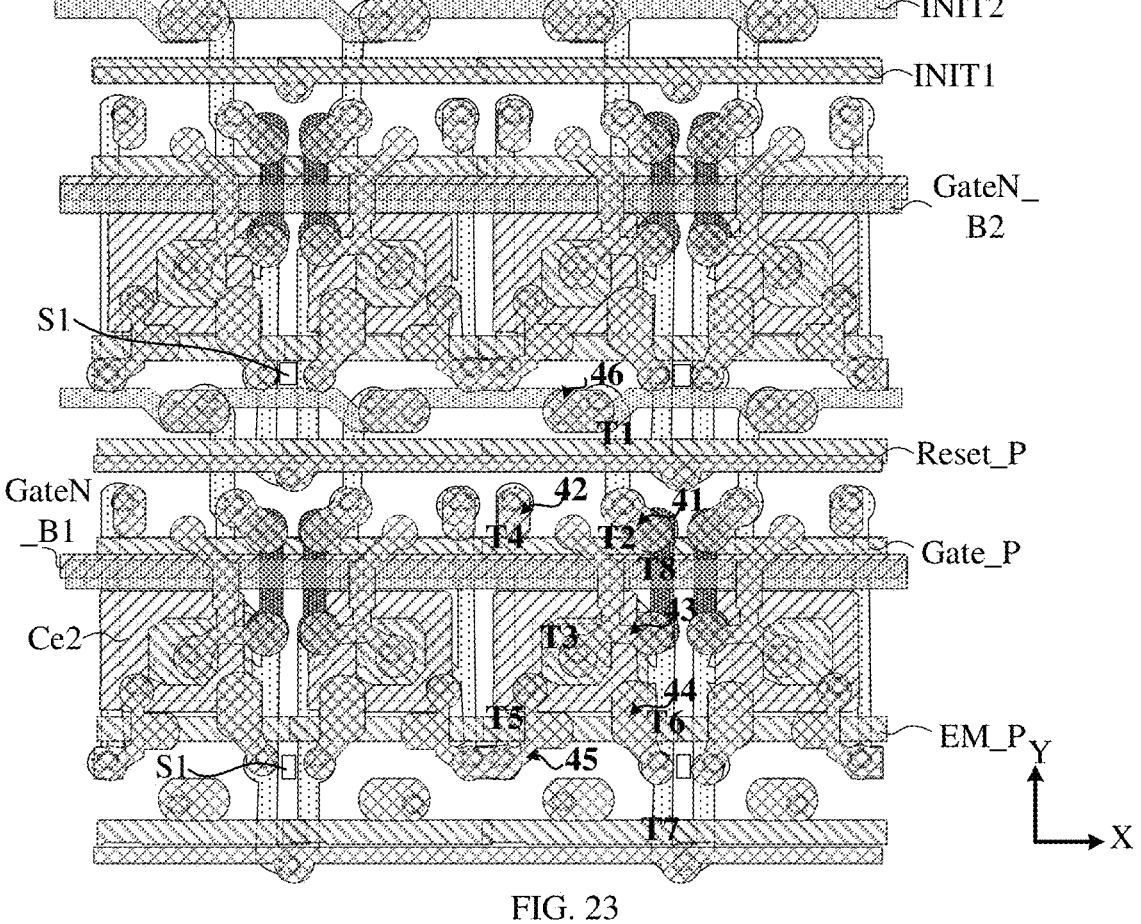

FIG. 23 shows a schematic plan view of a fourth conductive layer stacked on the third conductive layer. As shown in FIG. 23, the fourth conductive layer includes a first initial signal line INIT1, a first connection electrode 41, a second connection electrode 42, a third connection electrode 43, a fourth connection electrode 44, a fifth connection electrode 45, and a sixth connection electrode 46. In some embodiments, the fourth conductive layer can be referred to as a first source-drain metal (SD1) layer.

In some embodiments, in the second direction Y, the fourth conductive layers of any two adjacent columns of sub-pixels are mirror symmetric structures.

In some embodiments, the first initial signal line INIT1 extends along the first direction X, and the first initial signal line INIT1 is connected to the first region of the seventh active layer through the eighth via hole V8, so that the first electrode of the seventh transistor T7 has the same potential as the first initial signal line INIT1.

In some embodiments, one end of the first connection electrode 41 is connected to the first region of the second active layer (which is also the second region of the first active layer) through the third via hole V3, and the other end of the first connection electrode 41 is connected to the first region of the eighth active layer through the second via hole V2. In some embodiments, the first connection electrode 41 can serve as the first electrode of the eighth transistor T8, the first electrode of the second transistor, and the second electrode of the first transistor.

In some embodiments, the second connection electrode 42 is connected to the first region of the fourth active layer through the tenth via hole V10 on the one hand, and is connected to a data signal line Data subsequently formed through a thirteenth via hole V13 subsequently formed on the other hand. In some embodiments, the second connection electrode 42 can serve as the first electrode of the fourth transistor T4.

In some embodiments, one end of the third connection electrode 43 is connected to the second region of the eighth active layer through the first via hole V1, and the other end of the third connection electrode 43 is connected to the first electrode plate Ce1 through the fourth via hole V4. In some embodiments, the third connection electrode 43 can serve as the second electrode of the eighth transistor T8.

In some embodiments, the fourth connection electrode 44 is connected to the second region of the sixth active layer (which is also the second region of the seventh active layer) through the ninth via hole V9 on the one hand, and is connected to the first electrode connection electrode subsequently formed through a twelfth via hole V12 subsequently formed on the other hand. In some embodiments, the fourth connection electrode 44 can simultaneously serve as the second electrode of the sixth transistor T6 and the second electrode of the seventh transistor T7.

In some embodiments, the fifth connection electrode 45 (power connection electrode) is connected to the second electrode plate Ce2 through the sixth via hole V6 on the one hand, and is connected to the first region of the fifth active layer through the fifth via hole V5 on the other hand; and the fifth connection electrode 45 is configured to be connected to the first power line VDD subsequently formed through a fourteenth via hole V14 subsequently formed.

In some embodiments, one end of the sixth connection electrode 46 is connected to the first region of the first active layer through the seventh via hole V7, and the other end of the sixth connection electrode 46 is connected to the second initial signal line through the eleventh via hole V11, so that the first electrode of the first transistor T1 has the same potential as the second initial signal line INIT2.

Figure 24:
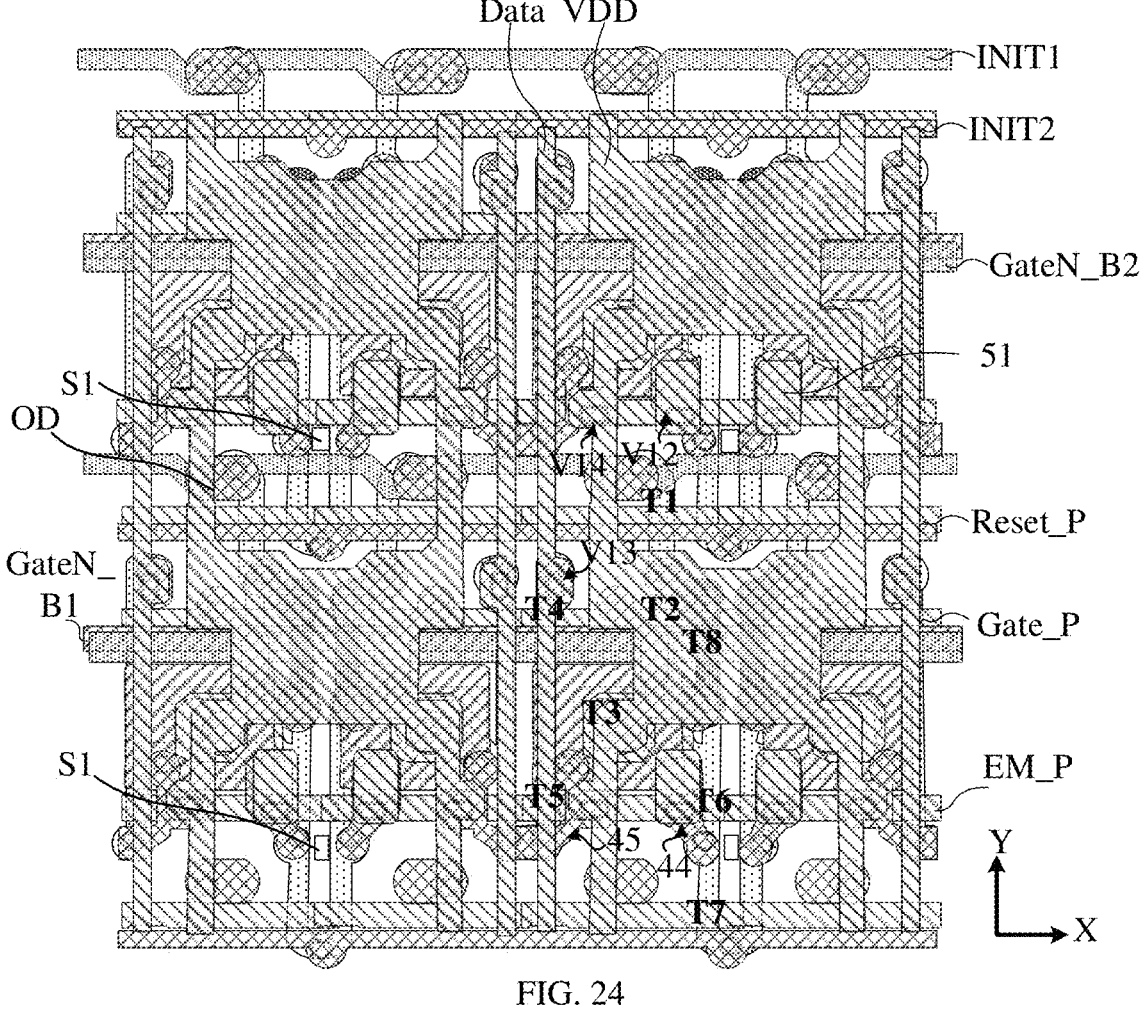

FIG. 24 shows a schematic plan view of a first planarization layer stacked on the fourth conductive layer and a fifth conductive layer stacked on the first planarization layer. In some embodiments, as shown in FIG. 24, the first planarization layer 97 includes a twelfth via hole V12, a thirteenth via hole V13, and a fourteenth via hole V14, and the fifth conductive layer includes a data signal line Data, a first power line VDD, and a first electrode connection electrode 51. In some embodiments, the fifth conductive layer can be referred to as a second source-drain metal (SD2) layer.

In some embodiments, in the second direction Y, the fifth conductive layers of any two adjacent columns of sub-pixels are mirror symmetric structures. In some other exemplary embodiments, in the second direction Y, the fifth conductive layers of any two adjacent columns of sub-pixels may not be mirror symmetric structures, and the area of the second source-drain metal layer below the first light-transmitting opening or the second light-transmitting opening can be increased as needed to improve the flatness of the first electrode (anode) of the light-emitting element formed in the upper layer, so that the sub-pixels are located on one plane as a whole, thereby reducing the color shift and improving the display quality.

In some embodiments, as shown in FIG. 24, in a repeating unit, the first power lines VDD in two adjacent columns of sub-pixels can be an integrated structure connected with each other. By making the first power lines VDD in two adjacent columns of sub-pixels be formed as an integrated structure connected with each other, the anode formed in the upper layer can be made flatter.

For example, the driving circuit layer includes third signal lines (e.g., the first power lines VDD mentioned above) which are arranged in parallel and periodically. The third signal lines extend along the second direction Y and are intersected with the first signal line and the second signal line, respectively. The third signal lines are configured to provide power signals to the plurality of sub-pixels. As shown in FIG. 18, the third signal line includes a hollowed-out portion OD, and the orthographic projection of the second light-transmitting opening S1 on the base substrate 111 is located within the orthographic projection of the hollowed-out portion OD on the base substrate 111. Accordingly, the orthographic projection of the first light-transmitting opening 140 on the base substrate 111 is located within the orthographic projection of the hollowed-out portion OD1 on the base substrate 111.

In some embodiments, the first electrode connection electrode 51 can have a rectangular shape, and the first electrode connection electrode 51 is connected to the fourth connection electrode 44 through the twelfth via hole V12.

In some embodiments, the first power line VDD is connected to the fifth connection electrode 45 through the fourteenth via hole V14.

In some embodiments, the data signal line Data extends along the second direction Y, and is connected to the second connection electrode 42 through the thirteenth via hole V13. Because the second connection electrode 42 is connected to the first region of the fourth active layer through the tenth via hole V10, the connection between the data signal line Data and the first electrode of the fourth transistor is realized, so that the data signal transmitted by the data signal line Data can be written into the fourth transistor.

Figures 25, 26:
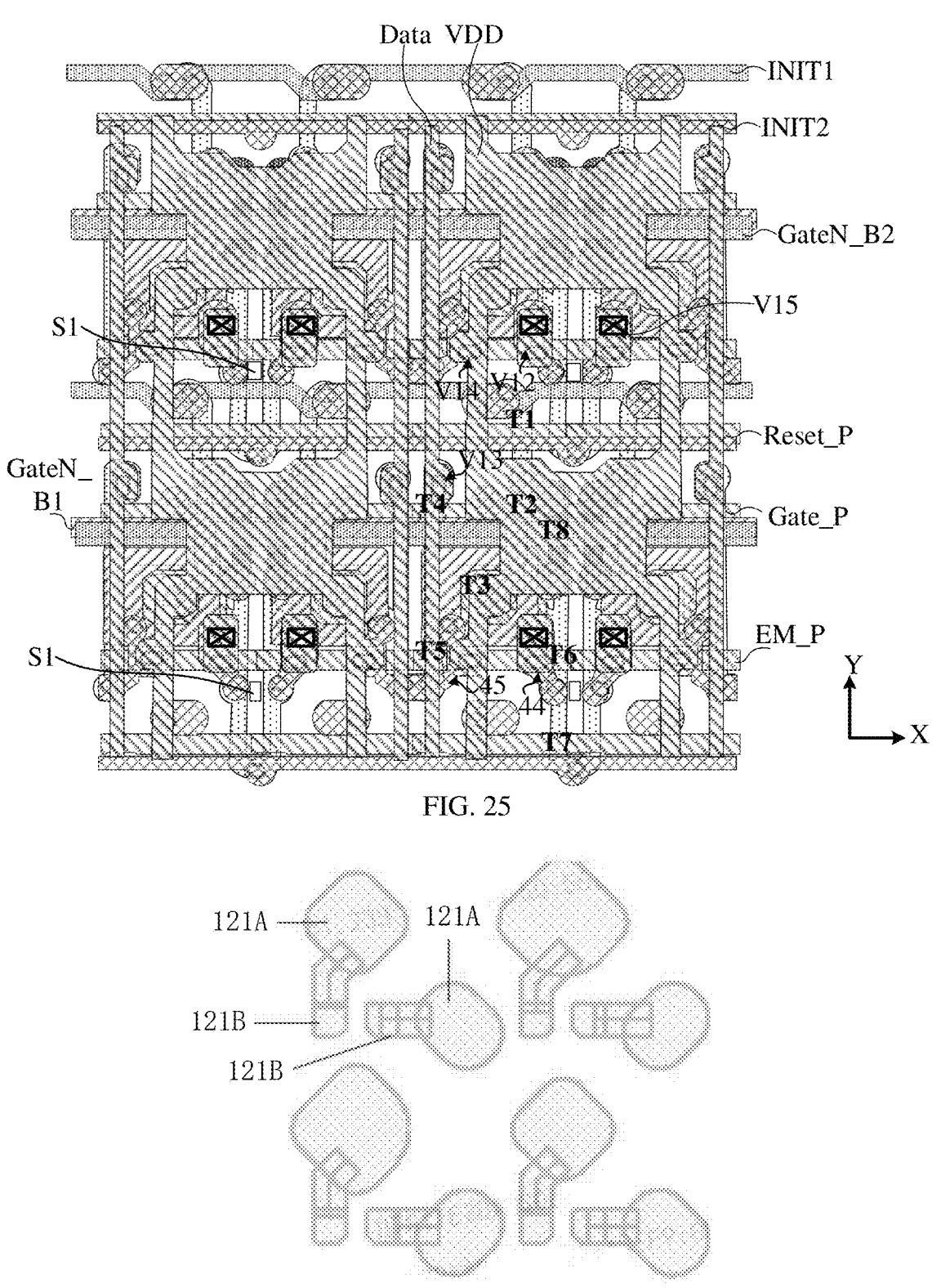

For example, FIG. 25 shows a schematic plan view of a second planarization layer stacked on the fifth conductive layer. In some embodiments, as shown in FIG. 25, the second planarization layer 98 includes a fifteenth via hole V15.

In some embodiments, the fifteenth via hole V15 is located in the region where the first electrode connection electrode 51 is located, and part of the second planarization layer in the fifteenth via hole V15 is removed to expose the surface of the first electrode connection electrode 51; and the fifteenth via hole V15 is configured such that the first electrode (e.g., anode) of the light-emitting element subsequently formed is connected to the first electrode connection electrode 51 through this via hole.

For example, for clarity, FIG. 26 shows a schematic plan view of a first electrode layer. As shown in FIG. 26, the first electrode layer includes first electrodes 121 of the light-emitting elements of the plurality of sub-pixels, each first electrode 121 includes a main portion 121A and a connection portion 121B, the main portion 121A is exposed by the sub-pixel opening 113, and the connection portion 121B is connected to the first electrode connection electrode 51 through a fifteenth via hole V15.

Because the first electrode connection electrode 51 is connected to the fourth connection electrode 44 through the twelfth via hole V12, and the fourth connection electrode 44 is further connected to the sixth active layer through the ninth via hole V9, it is realized that the pixel driving circuit can drive the light-emitting element to emit light.

Figure 27:
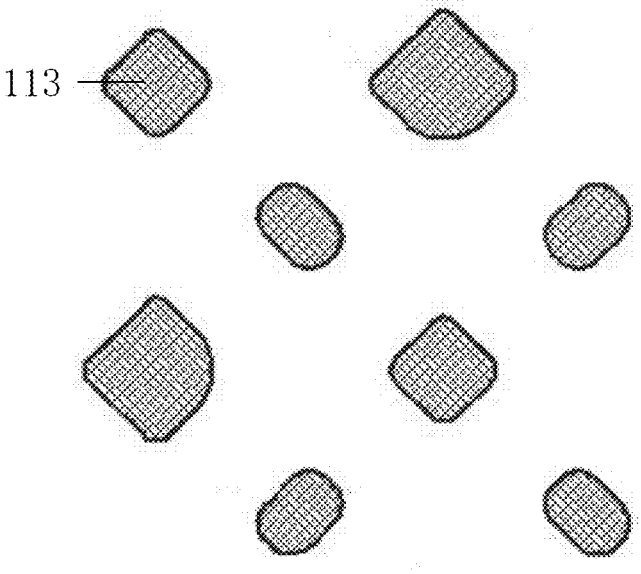

For example, FIG. 27 shows a schematic plan view of a pixel defining layer PDL. As shown in FIG. 27, the pixel defining layer PDL includes a plurality of sub-pixel openings 113, the shape of each of the plurality of sub-pixel openings 113 is the same as the shape of the main portion 121A of the first electrode 121, and the size thereof is slightly smaller than the size of the main portion 121A, so as to fully expose the main portion 121A.

For example, the structures and positional relationships of the spacer layer 190, the touch layer FM, the black matrix 135 and the color filters, which are located on the pixel defining layer PDL, can refer to those in FIG. 6, FIG. 11, FIG. 12 and FIG. 13, and details will not be repeated here.

In the embodiment of the present disclosure, the base substrate 111 can be a flexible substrate or a rigid substrate. The rigid substrate can be one or more of glass and quartz, but is not limited thereto; and the flexible substrate can be one or more of polyethylene terephthalate, ethylene terephthalate, polyether ether ketone, polystyrene, polycarbonate, poly aryl acid ester, polyarylate, polyimide, polyvinyl chloride, polyethylene and textile fiber, but is not limited thereto.

In some embodiments, the flexible substrate can include a first flexible material layer, a first inorganic material layer, a semiconductor layer, a second flexible material layer, and a second inorganic material layer which are stacked. The materials of the first flexible material layer and the second flexible material layer can be polyimide (PI), polyethylene terephthalate (PET) or a surface-treated polymer soft film, etc. The materials of the first inorganic material layer and the second inorganic material layer can be silicon nitride (SiNx) or silicon oxide (SiOx), etc., so as to improve the water/ oxygen resistance of the substrate. The material of the semiconductor layer can be amorphous silicon (a-si).

For example, the first conductive layer, the second conductive layer, the third conductive layer, the fourth conductive layer, and the fifth conductive layer can be made of metal materials, such as any one or more of silver (Ag), copper (Cu), aluminum (Al), titanium (Ti) and molybdenum (Mo), or be made of alloy materials of the above metals, such as aluminum neodymium alloy (AlNd) or molybdenum niobium alloy, and can be a single-layer structure or a multi-layer composite structure, such as Mo/Cu/Mo, etc. The insulating layer can adopt any one or more of silicon oxide (SiOx), silicon nitride (SiNx) and silicon oxynitride (SiON), and can be a single-layer structure, a multi-layer structure or a composite-layer structure. The planarization layer can be made of an organic material, and the plurality of touch lines TL in the touch layer FM can be made of a metal oxide material, such as indium tin oxide (ITO) or indium zinc oxide (IZO), etc. The first semiconductor layer can adopt poly-silicon (p-Si), and the second semiconductor layer (SML2) can adopt oxide.

The layer stack structure of the display substrate provided by the embodiment of the present disclosure is only an exemplary explanation. In some embodiments, the corresponding structure can be modified and the patterning process can be increased or decreased according to actual needs, without being limited in the embodiment of the present disclosure.

FIG. 28 is a schematic view illustrating stacked layers of a first light-transmitting opening and a color filter according to an embodiment of the present disclosure. As shown in FIG. 28, the orthographic projection of the first light-transmitting opening 140 on the base substrate 110 is surrounded by the orthographic projections of the first color filter 132A, the second color filter 132B, and the third color filter 132C on the base substrate 110.

For example, as shown in FIG. 28, the shape of the orthographic projection of the first light-transmitting opening 140 on the base substrate 110 is circular; of course, the embodiment of the present disclosure includes but is not limited to this case, and the shape of the orthographic projection of the first light-transmitting opening on the base substrate can also be any other shapes, such as a rectangle.

For example, as shown in FIG. 28, the shape of the orthographic projection of the first color filter 132A on the base substrate 110 is a hexagonal shape; the shape of the orthographic projection of the second color filter 132B on the base substrate 110 is a hexagonal shape; the shape of the orthogonal projection of the third color filter 132C on the base substrate 110 is a right-angled symmetric pentagonal shape. Of course, the embodiment of the present disclosure includes but is not limited to this case, and the shapes of the orthographic projections of these color filters on the base substrate can also be other shapes.

FIG. 29 is a schematic diagram of a light-shielding layer, a first electrode, and a sub-pixel opening provided by an embodiment of the present disclosure. As shown in FIG. 29, the orthographic projection of the second light-transmitting opening S1 on the base substrate 110 can be a long-striped shape, and both ends of the long-striped shape include protrusions, respectively.

An embodiment of the present disclosure further provides a display device. FIG. 30 is a schematic diagram of a display device provided by an embodiment of the present disclosure. As shown in FIG. 30, the display device 300 includes the above display substrate 100. Therefore, the display device can avoid the influence of stray light on normal display, and also has a high color gamut and a long standby time.

For example, in some exemplary embodiments, the display device can be any product or component having display function, such as a smart phone, a tablet computer, a television, a display, a notebook computer, a digital photo frame, a navigator, etc.

The following statements need to be explained.

(1) The drawings of the embodiments of the present disclosure only relate to the structure related to the embodiment of the present disclosure, and other structures can refer to the common design(s).

(2) In case of no conflict, the features in the same embodiment and in different embodiments of the present disclosure can be combined with each other.

The above are merely specific implementations of the present disclosure without limiting the protection scope of the present disclosure thereto. Any changes or substitutions easily occur to those skilled in the art within the technical scope of the present disclosure should be covered in the protection scope of the present disclosure. Therefore, the protection scope of the present disclosure should be based on the protection scope of the appended claims.

The invention claimed is:

1. A display substrate, comprising:

a driving substrate;

a plurality of light-emitting elements, located on the driving substrate;

a color filter layer, located at a side of the plurality of light-emitting elements away from the driving substrate, and comprising a plurality of color filters and a black matrix between adjacent color filters;

a first light-transmitting opening, located in the black matrix;

an optical adhesive layer, located at a side of the color filter layer away from the driving substrate; and a cover plate, located at a side of the optical adhesive layer away from the color filter layer, wherein the plurality of light-emitting elements are arranged in one-to-one correspondence with the plurality of color filters, a distance between one light-emitting element of the plurality of light-emitting elements and a corresponding color filter of the plurality of color filters in a direction perpendicular to the driving substrate is a vertical distance a, a distance between the light-emitting element and an edge of the first light-transmitting opening adjacent to the corresponding color filter in a direction parallel to the driving substrate is a lateral distance b, and the vertical distance a and the lateral distance b satisfy a formula as follows:

$$0.886 \times \frac{n2}{n1} \ll \frac{a}{\sqrt{a^2 + b^2}},$$

where n1 is a refractive index of the cover plate and n2 is a refractive index of air.

2. The display substrate according to claim 1, wherein the vertical distance a and the lateral distance b satisfy a formula as follows:

$$\frac{n2}{n1} \ll \frac{a}{\sqrt{a^2 + b^2}}.$$

3. The display substrate according to claim 1, wherein the vertical distance a and the lateral distance b satisfy a formula as follows:

$$\frac{2}{3} \ll \frac{a}{\sqrt{a^2 + b^2}}.$$

4. The display substrate according to claim 1, wherein the refractive index of the cover plate is less than or equal to 1.55.

5. The display substrate according to claim 1, wherein the plurality of light-emitting elements comprise a first light-emitting element, a second light-emitting element, and a third light-emitting element, and the plurality of color filters comprise a first filter, a second filter, and a third filter, the first filter is configured to allow light of a first color to pass through, the second filter is configured to allow light of a second color to pass through, the third filter is configured to allow light of a third color to pass through, the first light-emitting element is arranged corresponding to the first filter, the second light-emitting element is arranged corresponding to the second filter, and the third light-emitting element is arranged corresponding to the third filter.

6. The display substrate according to claim 5, wherein a distance between one first light-emitting element and a corresponding first color filter in the direction perpendicular to the driving substrate is a first vertical distance a1, and a distance between the first light-emitting element and an edge of the first light-transmitting opening adjacent to the corresponding first color filter in the direction parallel to the driving substrate is a first lateral distance b1, a distance between one second light-emitting element and a corresponding second color filter in the direction perpendicular to the driving substrate is a second vertical distance a2, and a distance between the second light-emitting element and an edge of the first light-transmitting opening adjacent to the corresponding second color filter in the direction parallel to the driving substrate is a second lateral distance b2, a distance between one third light-emitting element and a corresponding third color filter in the direction perpendicular to the driving substrate is a third vertical distance a3, and a distance between the third light-emitting element and an edge of the first light-transmitting opening adjacent to the corresponding third color filter in the direction parallel to the driving substrate is a third lateral distance b3, the first lateral distance b1, the second lateral distance b2, and the third lateral distance b3 are different from each other.

7. The display substrate according to claim 6, wherein a1, b1, a2, b2, a3, and b3 satisfy a formula as follows:

$$\frac{a3}{\sqrt{a3^2 + b3^2}} \ll \frac{a2}{\sqrt{a2^2 + b2^2}} \ll \frac{a1}{\sqrt{a1^2 + b1^2}}.$$

8. The display substrate according to claim 7, wherein a size of the first light-transmitting opening between the first color filter and the second color filter is greater than a size of the first light-transmitting opening between the first color filter and the third color filter.

9. The display substrate according to claim 7, wherein a size of the first light-transmitting opening between the first color filter and the second color filter is greater than a size of the first light-transmitting opening between the second color filter and the third color filter.

10. The display substrate according to claim 5, wherein the first light-emitting element is configured to emit light of the first color, the second light-emitting element is configured to emit light of the second color, and the third light-emitting element is configured to emit light of the third color.

11. The display substrate according to claim 10, wherein the first color is red, the second color is green, and the third color is blue.

12. The display substrate according to claim 1, wherein each of the plurality of light-emitting elements comprises an anode, an organic light-emitting layer, and a cathode.

13. The display substrate according to claim 1, further comprising:

an optical sensor, located at a side of the driving substrate away from the plurality of light-emitting elements, the display substrate comprises a display region and a non-display region surrounding the display region, the display region comprises a fingerprint identification region and a normal display region at an outer side of the fingerprint identification region, and the first light-transmitting opening is located in the fingerprint identification region.

14. The display substrate according to claim 1, wherein the driving substrate comprises:

a base substrate;

a light-shielding layer, disposed on the base substrate, and comprising a plurality of second light-transmitting openings;

a pixel driving circuit layer, disposed at a side of the light-shielding layer away from the base substrate; and a pixel defining layer, disposed at a side of the pixel driving circuit layer away from the base substrate and comprising a plurality of sub-pixel openings, wherein the pixel driving circuit layer comprises a plurality of pixel driving circuits, the plurality of pixel driving circuits are electrically connected with the plurality of light-emitting elements and configured to drive the plurality of light-emitting elements to emit light, the plurality of light-emitting elements are disposed in the plurality of sub-pixel openings and form a plurality of sub-pixels with the plurality of pixel driving circuits;

orthographic projections of at least part of the plurality of second light-transmitting openings on the base substrate overlap with an orthographic projection of the first light-transmitting opening on the base substrate.

15. The display substrate according to claim 14, wherein orthographic projections of the plurality of second light-transmitting openings on the base substrate are located between orthographic projections of the plurality of sub-pixel openings on the base substrate, and the orthographic projections of the plurality of sub-pixel openings on the base substrate overlap with orthographic projections of the plurality of color filters on the base substrate, respectively.

16. The display substrate according to claim 14, wherein the orthographic projections of at least part of the plurality of second light-transmitting openings on the base substrate are located within the orthographic projection of the first light-transmitting opening on the base substrate.

17. The display substrate according to claim 14, wherein the pixel driving circuit layer further comprises a first signal line and a second signal line which are arranged in parallel and periodically, and the first signal line and the second signal line are configured to provide different electrical signals to the plurality of pixel driving circuits,

40 an orthographic projection of each of the plurality of second light-transmitting openings on the base substrate is located between orthographic projections of the first signal line and the second signal line that are adjacent to each other on the base substrate.

18. The display substrate according to claim 17, wherein the pixel driving circuit layer comprises third signal lines which are arranged in parallel and periodically, each of the third signal lines is intersected with the first signal line and the second signal line, respectively, and the third signal line is configured to provide a power signal to the plurality of pixel driving circuits, the third signal line comprises a hollowed-out portion, and an orthographic projection of each of the plurality of second light-transmitting openings on the base substrate is located within an orthographic projection of the hollowed-out portion on the base substrate.

19. The display substrate according to claim 18, wherein the orthographic projection of the first light-transmitting opening on the base substrate does not overlap with orthographic projections of the first signal line and the second signal line on the base substrate, the orthographic projection of the first light-transmitting opening on the base substrate is located within the orthographic projection of the hollowed-out portion on the base substrate.

20. A display device, comprising the display substrate according to claim 1.

* * * * *